United States Patent [19]
Sato et al.

[11] Patent Number: 5,757,149
[45] Date of Patent: May 26, 1998

[54] DRIVE CONTROL APPARATUS

[75] Inventors: Mikio Sato; Hiroaki Takeishi, both of Utsunomiya, Japan

[73] Assignee: Canon Kabushiki Kaisha, Tokyo, Japan

[21] Appl. No.: 697,950

[22] Filed: Sep. 4, 1996

[30] Foreign Application Priority Data

Sep. 4, 1995 [JP] Japan ................... 7-248266
Nov. 24, 1995 [JP] Japan ................... 7-327872

[51] Int. Cl.$^6$ ............... H02K 41/00; H01L 21/68; B65G 49/07
[52] U.S. Cl. ............... 318/135; 318/687; 437/924
[58] Field of Search ............... 318/135, 685, 318/687; 437/924; 356/358

[56] References Cited

U.S. PATENT DOCUMENTS

| | | |
|---|---|---|
| 4,496,239 | 1/1985 | Isohata et al. . |
| 4,659,227 | 4/1987 | Sato et al. . |
| 4,677,474 | 6/1987 | Sato et al. . |
| 4,714,400 | 12/1987 | Barnett et al. ............ 318/687 X |
| 4,747,608 | 5/1988 | Sato et al. . |
| 4,870,288 | 9/1989 | Abuku et al. . |
| 5,216,590 | 6/1993 | Ota ............ 310/90.5 X |
| 5,270,771 | 12/1993 | Sato . |
| 5,499,099 | 3/1996 | Sato et al. . |
| 5,504,407 | 4/1996 | Wakui et al. . |
| 5,511,930 | 4/1996 | Sato et al. . |
| 5,557,156 | 9/1996 | Elings ............ 310/316 |
| 5,609,136 | 3/1997 | Tuken ............ 123/357 |

FOREIGN PATENT DOCUMENTS

| | | |
|---|---|---|
| 0 421 527 A1 | 4/1991 | European Pat. Off. . |
| 0 559 397 A2 | 9/1993 | European Pat. Off. . |
| 0 632 568 A1 | 1/1995 | European Pat. Off. . |
| 01298410 | 12/1989 | Japan . |
| 07161798 | 6/1995 | Japan . |

*Primary Examiner*—Steven L. Stephan
*Assistant Examiner*—Judson H. Jones
*Attorney, Agent, or Firm*—Fitzpatrick, Cella, Harper & Scinto

[57] ABSTRACT

A target state quantity generating unit generates a target state quantity for a stage, and a laser interferometer detects the current state quantity (position) of the stage. Based on the target state quantity and the detected state quantity (position), a compensation system constituted by a variable phase compensator and a PID compensator controls the driving operation of the stage. A memory unit stores forward and reverse gain tables, and provides adjustment information for adjusting the compensation system in correspondence with the state quantity of the stage. The corresponding gain table is selected on the basis of the driving direction of the stage, and the adjustment information is read out from the selected gain table on the basis of the position of the stage. The corner frequency of the variable phase compensator is changed on the basis of the readout adjustment information.

32 Claims, 20 Drawing Sheets

FORWARD DIRECTION

REVERSE DIRECTION

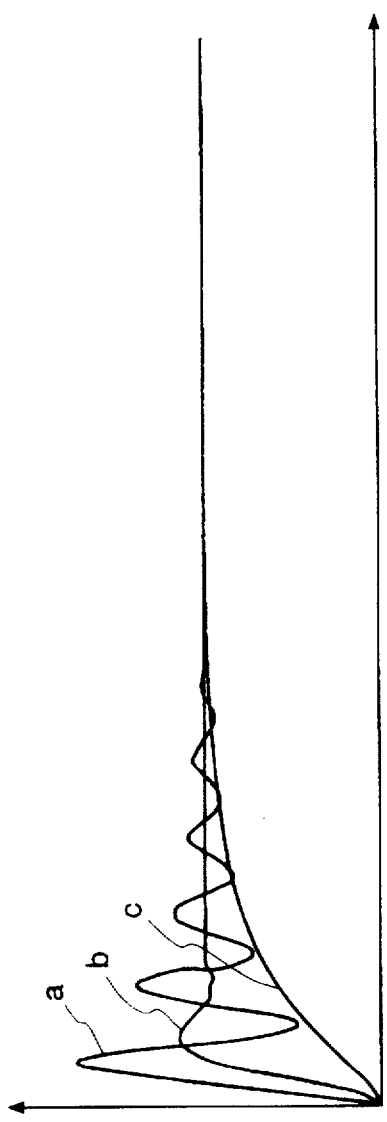
F I G. 6A
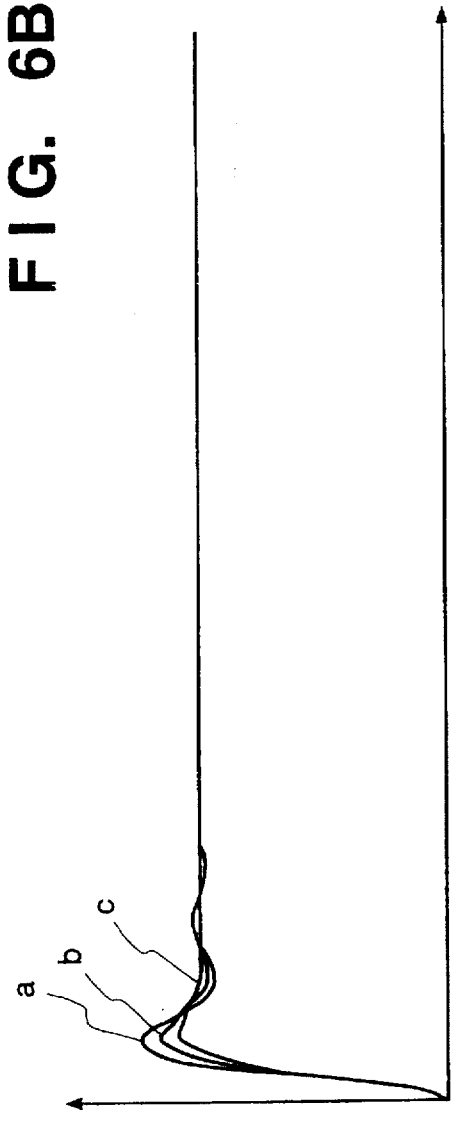
F I G. 6B

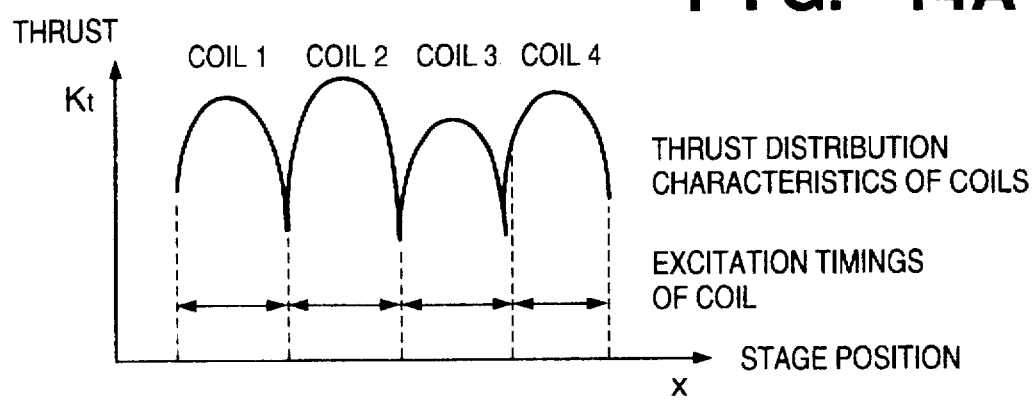
FIG. 14A
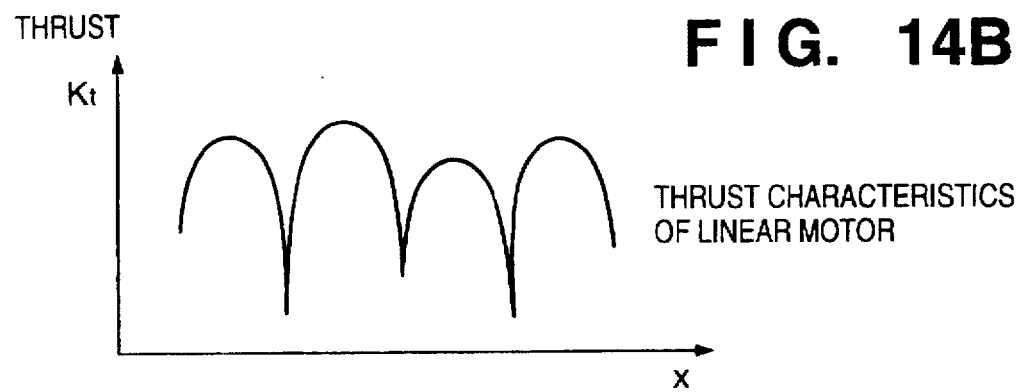
FIG. 14B
FIG. 15
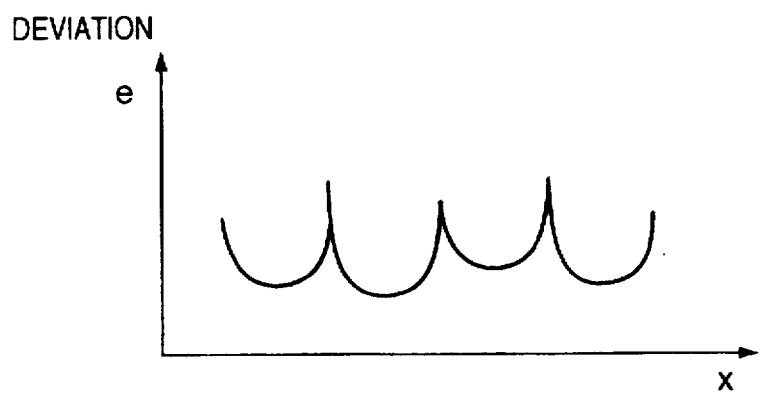

THRUST / POSITION

DRIVE CONTROL APPARATUS

BACKGROUND OF THE INVENTION

The present invention relates to a precision control apparatus for performing precision alignment, precision velocity control, and the like and, more particularly, to a precision control apparatus suitable for a synchronous scan type semiconductor exposure apparatus.

A precision control technique such as precision alignment, precision velocity control, and the like in industrial or information equipments is required to have higher precision and higher velocity as the equipments have more complicated structures, a larger number of functions, smaller line widths, and the like.

For example, a semiconductor exposure apparatus will be taken as an example. In recent years, upon rapid increase in degree of integration of semiconductor elements, the required alignment precision has reached about nm so far, and it is expected that alignment precision on the nanometer order will be required within several years. In addition, in order to improve the throughput, such high-precision control must be performed at higher velocity.

Furthermore, chips are becoming larger in size. In order to cope with such large chips, a so-called synchronous scan type exposure apparatus has been developed in place of a conventional step-movement type exposure apparatus, i.e., a so-called stepper. In this apparatus, as shown in FIG. 11, an exposure process is performed while synchronously moving a reticle 32 and a wafer 31 at a constant velocity, thereby realizing a chip size that cannot be realized by the conventional stepper.

FIG. 11 shows the arrangement of a synchronous scan type reduction projection exposure apparatus. As shown in FIG. 11, the wafer 31 and the reticle 32 are synchronously moved in opposite directions at a velocity ratio equal to a selected reduction ratio. At this time, light emitted by a light source (not shown) is converted into strip-shaped light L having a small width in the scan direction by a rectangular stop. The above-mentioned synchronous scan operation is performed while forming an image of a chip drawn on the reticle 32 at a desired position on the wafer 31 at a predetermined reduction ratio via a lens 33. With this arrangement, the exposure operation of a chip size that cannot be realized by the conventional step-driving type exposure apparatus (stepper) can be attained.

FIG. 12 is a typical block diagram of a control system in the synchronous scan type exposure apparatus. A target state quantity (i.e., a target position in this case) with respect to a wafer stage 43 is generated by a target state quantity generating unit 41, and is supplied to a wafer control system 46. At the same time, the target state quantity is also supplied to a target state quantity conversion unit 48. The target state conversion unit 48 multiplies the target state quantity by $1/\beta$ (where $\beta$ is the reduction ratio) to generate a target state quantity with respect to a reticle stage 45, and outputs the converted quantity to a reticle control system 47. In this manner, the synchronous target positions respectively for the wafer stage 43 and the reticle stage 45 are generated. A deviation $e_m$ between the target state quantity in the wafer control system 46 and a position $X_m$ of the wafer stage 43 is multiplied by $1/\beta$ by a synchronous error correction unit 49, and is supplied to the reticle control system 47. Thus, a synchronous error $e_{sync}$ is suppressed.

As can be seen from the above description, the control system of the synchronous scan type exposure apparatus is a master-slave control system which has the wafer control system 46 as the master system and the reticle control system 47 as the slave system. A final performance index is given by a synchronous error $e_{sync}$ that is the deviation between the position $X_m$ of the wafer stage 43, and a value obtained by multiplying the position of the reticle stage 45 with $\beta$.

Technical problems in such scan system are summarized into the following two problems:

(1) a technical problem for a so-called constant-velocity scan technique in which the master and slave control systems are considered as independent 1-input/output systems, and the respective control objects are moved at a constant velocity with high precision; and (2) a technical problem for a so-called synchronous control technique for suppressing a synchronous error between the master and slave control systems.

However, problem (2) is a problem associated with the coupling method of the control systems, and problem (1) is most important. Therefore, the following description will be focused on technical problem (1), i.e., the technical problem upon performing high-precision scan control at high velocity.

The minimum line width of a chip is about 250 nm in the case of a 256M DRAM, and a scan type semiconductor exposure apparatus must perform scan control while maintaining precision between the wafer and the reticle to be about a fraction of the minimum line width. In order to realize such high precision, nonlinear friction of a driving system poses a serious problem, although it does not pose any problem in a conventional step-driving type exposure apparatus.

More specifically, in the conventional step-driving type exposure apparatus, the stage is moved to a desired position, and upon completion of settling, an exposure process is performed. Therefore, even when slight friction or the like is present within the step moving range, and the stage suffers slight velocity nonuniformity during traveling (although the alignment time is slightly prolonged), they do not adversely influence the yield. In contrast to this, in the synchronous scan type exposure apparatus, the presence of a factor that disturbs high-precision, constant-velocity movement such as friction within a scan region, in other words, a factor that disturbs the synchronous relationship between the wafer and the reticle, distorts an exposed image and adversely influences the yield.

In recent years, as a driving element for such high-precision scan control apparatus, a non-contact movement type driving means using an air bearing and a linear motor has been put into a practical application, and more semiconductor exposure apparatuses use such means. As compared to a conventional driving element using a ball screw, a roller bearing, and a rotation motor, friction is reduced, thus contributing to an improvement in control precision.

When a linear motor is used as a driving element, a method of assuring a long-stroke movable range using a plurality of voice coils or permanent magnets as stators is popularly used. This is for the following reason. That is, in the case of a moving magnet type motor in which the coil side serves as a stator, if a long-stroke movable range is covered by a single voice coil, the driving current increases, and a problem of thermal deformation due to heat generated by the coil readily occurs. On the other hand, in the case of a moving coil type motor in which the permanent magnets serve as stators, it is difficult to manufacture a permanent magnet which can cover a long stroke. FIG. 13 shows an example of a non-contact movement type stage using a moving magnet type linear motor. The stage shown in FIG.

13 has degrees of freedom in two orthogonal, horizontal directions, and with this stage, the movement control of the wafer or reticle is performed.

When a long stroke is covered by a linear motor having a plurality of stators, thrust nonuniformity is generated upon switching the stators. FIGS. 14A and 14B show this state. More specifically, thrust nonuniformity is also generated depending on the stator position due to variations in magnetic force of coils or permanent magnets as a plurality of stators, variations in magnetic force depending on the stator position, or excitation timing shifts of coils when the stators comprise voice coils, and the like. With these variations, the deviation upon scanning the stage at a constant velocity depends on the thrust nonuniformity, as shown in FIG. 15. In particular, as the velocity increases, the deviation nonuniformity increases. For this reason, when synchronous scan control is performed in such control system, its synchronous error also depends on the thrust nonuniformity. Therefore, the scan velocity cannot be sufficiently increased, and hence, the throughput of the apparatus cannot be improved.

In order to remove the influence of the thrust nonuniformity, a method of reducing the deviation nonuniformity due to the thrust nonuniformity by changing the gain of the control system using a table or function depending on the position is conventionally used. In a typical method, a variable gain type compensator that can change the gain of the entire control system is used. An example of this method is described in Japanese Patent Publication No. 5-305303 titled "alignment table apparatus".

More specifically, as shown in FIG. 16A, a variable gain g(x) in a variable gain type PID compensator 62 is fixed to be 1, and a stage target state quantity for driving the stage on a scan traveling region at a constant velocity, i.e., a target position $x_r(t)$, is generated by a target state quantity generating unit 61, thus performing a so-called preliminary scan operation. A data sequence u(x) having the position of a stage 63 as an index is generated using a command value u(t) to the stage 63 and displacement data x(t) of the stage 63, and is stored in a memory unit 64. As shown in FIG. 16B, a gain table g(x) is generated by cutting the high-frequency components of the data sequence u(x) and then normalizing the data sequence u(x), thus updating data in the memory unit 64. Upon execution of scan control, the gain of the variable gain type PID compensator 62 is changed by a varying unit 65 on the basis of the gain table g(x).

As a normalization method, a method of setting an expected value of g(x) to be 1, a method of giving a bias value to u(x) so that the maximum value of g(x) becomes 1, and the like may be used. With such conventional technique, the influence of the thrust nonuniformity can be suppressed, and synchronous errors during the scan operation can be reduced.

However, the conventional technique suffers the following problems in the case of, e.g., the gain table look-up method.

First, upon formation of a gain table by a preliminary scan operation, since disturbances are applied to the control system, data of the gain table g(x) is disturbed by various disturbances in addition to the trend due to the thrust nonuniformity.

Of disturbances, especially, disturbances which depend on the moving direction pose a serious problem. As one of such disturbances, an influence due to a tilt of an antivibration table that carries the stage is known. When the stage is located at an end portion of the anti-vibration table, the tilt, θ, of the anti-vibration table increases due to the influence of the gravity of the stage as compared to a case wherein the stage is located at the center of the anti-vibration table. Therefore, a disturbance force $F_G$ of the gravity with respect to the stage depends on the direction of travel, as shown in FIG. 17, and especially has a large influence at the end portion. Therefore, since this influence is applied upon forming a gain table by a preliminary scan operation, when the influence of the thrust nonuniformity is to be removed by a single gain table as in the conventional technique, the control characteristics especially at the end portion considerably deteriorate depending on the difference in stage feed direction.

Second, in the conventional method, since the gain of the entire control system is changed by the gain table g(x) for correcting the thrust nonuniformity, if the value of the gain table g(x) largely varies, the local characteristics of the control system, i.e., transient response characteristics, disturbance suppression characteristics, and the like largely vary due to this influence. In practice, when a gain table is formed by a preliminary scan operation, since disturbances are applied to the control system, the data of the gain table g(x) is disturbed by various disturbances in addition to the trend of the thrust nonuniformity.

Therefore, due to these problems, the local control characteristics largely vary in the conventional control apparatus which adopts the gain table look-up method. In an actual scan operation, acceleration, constant-velocity scan, and deceleration operations are repeated in correspondence with the exposure regions of a plurality of chips arranged within the movable range of the stage. Therefore, when the local control system characteristics largely vary as in the conventional technique, the acceleration and deceleration times vary, and the throughput of the apparatus is considerably limited. The same problems are posed when the gain of the control system is changed by a function.

The linear motor as the driving element will be described in detail below.

FIGS. 18A to 18G show an example of the arrangement of a poly-phase linear motor having a plurality of coils. Referring to FIGS. 18A to 18G, reference numeral 212 denotes linear motor coils (stators), which are assigned Nos. 1 to 4 for the sake of convenience. Reference numeral 213 denotes movable magnets (movable members), which are arranged so that adjacent or opposing magnets have opposite polarities.

The positions of the movable member 213 are detected by, e.g., Hall elements arranged in the coils, and by detecting the polarities (N and S poles) of the movable magnets 213, a predetermined coil is energized. FIGS. 18A to 18G also show a method of selecting the coil to be energized. Note that marks ⓧ and ⦿ indicate the directions of currents to be supplied to the coils. The circuit arrangement for driving the poly-phase linear motor with the arrangement shown in FIGS. 18A to 18G is described in Japanese Patent Laid-Open No. 1-298410.

In the poly-phase linear motor shown in FIGS. 18A to 18G, the thrusts generated by the respective coil portions are not always equal to each other. Adjacent coils are normally arranged to be separated by a given gap. Due to the presence of the gap between adjacent coils, the thrust also varies depending on the position of the movable members, and consequently, a thrust distribution shown in FIG. 19 is normally obtained. Therefore, for example, when constant-velocity control of the movable members is to be performed, it is impossible to sufficiently reduce the control deviation or control error due to the influence of such thrust variation.

As the velocity of the movable member increases, since the frequency of the thrust variation shown in FIG. 19 also increases, the influence of the thrust variation appears more easily. This can be explained using a block diagram shown in FIG. 20 that approximates a motor by an integrator. FIG. 20 shows a velocity control system of a motor that constitutes a velocity feedback loop, and a PI (proportional+integral) compensator is arranged for the sake of simplicity. Also, $K_t$ is a torque constant, and M is the mass of a movable portion.

From FIG. 20, the transfer function (disturbance suppression characteristics) from a thrust disturbance T to a velocity V is given by equation (1) below, and exhibits derivative characteristics in the low-frequency range:

$$\frac{V}{T}(s) = \frac{s}{M\omega_n^2} \cdot \frac{1}{1 + \frac{2\xi}{\omega_n}s + \frac{1}{\omega_n^2}s^2} \quad (1)$$

$$\omega_n = \sqrt{\frac{K_t K_p K_i}{M}} \quad \xi = \frac{1}{2}\sqrt{\frac{K_t K_p}{MK_i}}$$

Therefore, as the velocity of the movable members increases, the influence of the thrust disturbance appears more easily. Similarly, as the mass of the movable portion (load) is smaller, the gain of equation (1) becomes larger. Consequently, the disturbance suppression performance deteriorates. In other words, as the mass becomes larger, the system is less susceptible to the influence of disturbances caused by the thrust variation, and this fact is well known as a so-called "flywheel ring effect".

As can be seen from equation (1), in order to improve the thrust disturbance suppression performance, the control frequency range need only be broadened by increasing, e.g., the gain of the PI compensator. However, in this case, since the resonance point of a mechanical system generated due to, e.g., the connection state of a load may be excited, the expected control frequency range cannot always be obtained.

SUMMARY OF THE INVENTION

The present invention has been made in consideration of the above-mentioned problems, and has as its object to provide a driving control apparatus which can effectively suppress characteristic variations of a control system and can improve control precision.

It is another object of the present invention to provide a driving control apparatus which holds a plurality of kinds of adjustment information based on operation states of a driving portion, selects appropriate adjustment information on the basis of the operation state of the driving portion, and can control the driving portion.

It is still another object of the present invention to provide a driving control apparatus which holds a plurality of kinds of adjustment information corresponding to driving directions of a driving portion, selects corresponding adjustment information in accordance with the driving direction of the driving portion, and can control the driving portion.

It is still another object of the present invention to provide a driving control apparatus which can control phase compensation in a driving control system on the basis of a state quantity obtained from a driving portion.

It is still another object of the present invention to provide a driving control apparatus which can control the corner frequency of phase compensation of a driving control system on the basis of a state quantity obtained from a driving portion, and can effectively suppress characteristic variations of the control system.

In order to achieve the above object, a driving control apparatus according to one aspect of the present invention comprises the following arrangement. That is, the driving control apparatus which has a controlled object, driving means for driving the controlled object, state quantity measuring means for measuring a state quantity of the controlled object, target state quantity generating means for generating a target value of the state quantity of the controlled object, control means for generating a command value to be supplied to the driving means on the basis of the state quantity of the controlled object measured by the state quantity measuring means and the target state quantity generated by the target state quantity generating means, a function of the state quantity of the controlled object measured by the state quantity measuring means or a table using the state quantity as an index, and varying means for varying characteristics of the control means on the basis of a function value of the function or a value of the table, is characterized by comprising a plurality of functions of the state quantity of the controlled object or a plurality of tables using the state quantity as an index depending on a moving direction of the controlled object. Alternatively, the driving control apparatus is characterized in that the apparatus has a phase lead-lag compensation element and/or a phase lag-lead compensation element with a variable corner frequency, and the corner frequency is changed by the function of the state quantity of the controlled object or the table using the state quantity as an index.

It is still another object of the present invention to provide a driving control apparatus for a linear motor, which can sufficiently suppress any control deviation caused by thrust variations and the like of a motor even when a sufficiently high gain of a compensator cannot be assured due to the presence of a resonance point.

A driving control apparatus for a linear motor according to an example of the present invention is characterized by comprising a look-up table which holds correction information of a control deviation at each respective points in the driving direction of the linear motor, and in that control is made while adding values obtained by sequentially looking up the look-up table during a driving operation to the control deviation. With this control, any control deviation component caused by, e.g., a thrust variation is compensated for in advance, and control can be made while sufficiently suppressing generation of a control deviation caused by, e.g., a thrust variation.

The driving control apparatus for a linear motor according to the present invention is characterized in that the apparatus forms a look-up table on the basis of a time sequence of the state quantities of a system, i.e., of the positions of a movable member and control deviations, which are obtained upon driving the linear motor prior to a table look-up operation.

Also, the driving control apparatus for a linear motor according to the present invention is characterized in that the apparatus forms a look-up table on the basis of the pre-processing result, using a linear phase digital filter, of a time sequence of state quantities of a system obtained upon driving the linear motor prior to a table look-up operation, and the cutoff frequency of the filter is set to be lower than the lower limit of a servo loop frequency range. With this control, a table free from high-frequency components caused by external noise can be formed, and stable control can be made based on this table.

The driving control apparatus for a linear motor according to the present invention is characterized in that the apparatus generates a coefficient sequence for correcting the look-up table on the basis of a result of the driving operation of the linear motor using the look-up table formed by the above-mentioned method. With this control, the control deviation suppression effect can be further enhanced.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 6A is a graph showing the step responses in a general control system;

FIG. 6B is a graph showing the step responses according to the first embodiment;

FIG. 14A is a graph showing the thrust distribution characteristics of coils of the linear motor;

FIG. 14B is a graph showing the thrust characteristics of the linear motor;

FIG. 15 is a graph showing the thrust nonuniformity of the linear motor;

DETAILED DESCRIPTION OF THE PREFERRED EMBODIMENTS

Preferred embodiments of the present invention will now be described in detail in accordance with the accompanying drawings.

[First Embodiment]

The first embodiment of the present invention will be described below while taking as an example a wafer stage control system using a moving magnet type linear motor.

Figure 1:
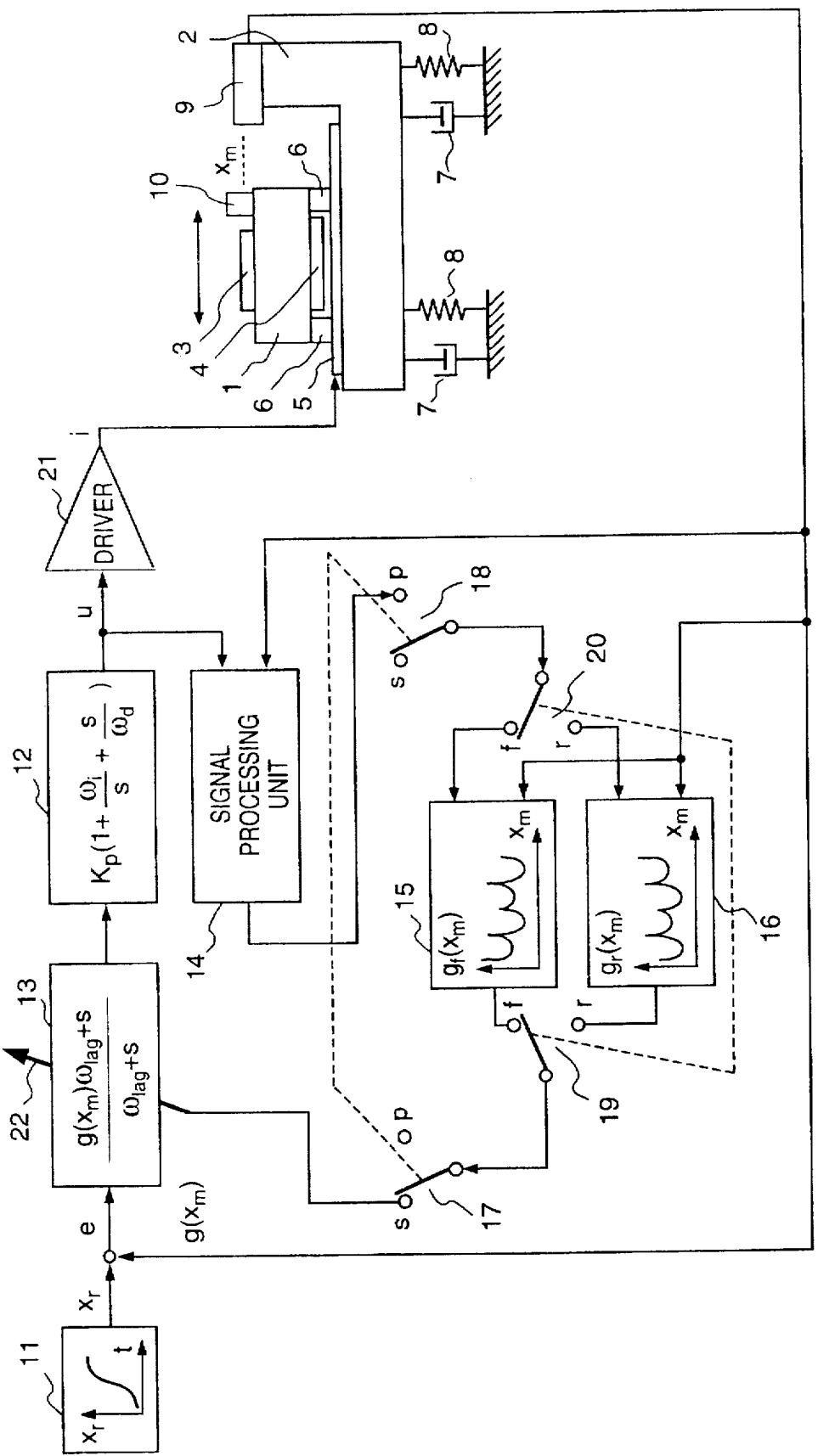
FIG. 1 is a block diagram showing the control arrangement of a precision control apparatus according to the first embodiment of the present invention.

In a block diagram shown in FIG. 1, reference numeral 1 denotes a stage in a synchronous scan type reduction projection exposure apparatus; 2, an anti-vibration table; 3, a wafer carried on the stage 1; 4, a movable member of a linear motor, which is fixed to the stage 1; 5, a stator of the linear motor, which is fixed to the anti-vibration table 2; 6, static pressure bearings; 7, dampers that act in their supporting direction with respect to the anti-vibration table 2; 8, springs for supporting the anti-vibration table 2; 9, a laser interferometer for measuring the position of the stage 1; 10, a mirror fixed on the stage 1 and adapted to reflect a laser beam emitted by the laser interferometer 9; 11, a target state quantity generating unit for generating a target position of the stage 1; 12, a PID compensator connected to the output terminal of a variable phase compensator 13; 13, a variable phase compensator corresponding one of the characteristic features of this embodiment; 14, a signal processing unit for a driving signal u; 15 and 16, memory units for respectively storing gain tables for forward and reverse feed operations corresponding to one of the characteristic features of this embodiment; 17 and 18, switches which are switched between a preliminary scan mode and a main scan mode; 19 and 20, switches which are switched between forward and reverse stage feed modes; 21, a driver for supplying a driving signal to the linear motor; and 22, a varying unit for the variable phase compensator 13.

The stage 1 that carries the wafer 3 moves in a non-contact manner on the anti-vibration table 2 in the X-axis direction by the movable member 4, the stator 5, and the static pressure bearings 6. The anti-vibration table 2 is shielded from floor vibrations by the dampers 7 and the springs 8. A displacement $X_m$ of the mirror 10 on the stage 1 with respect to the anti-vibration table 2 is measured by the laser interferometer 9. A position deviation e is generated based on a target state quantity, i.e., a target position $X_r$ of the stage 1 generated by the target state quantity generating unit 11, and the displacement $x_m$ of the stage 1 measured by the laser interferometer 9, and is supplied to a so-called serial compensation unit constituted by the variable phase compensator 13 and the PID compensator 12. The characteristic of the compensator 12 is indicated by using corner frequency ωi and ωd as shown in FIG. 1. Furthermore, the output, u, from the serial compensation unit is supplied to the driver 21, and is current-amplified. The current output, i, from the driver 21 is supplied to the stator 5 of the linear motor.

FIG. 1 is a block diagram showing the control arrangement of a precision control apparatus according to the first embodiment. The major features of the control system of the first embodiment are that the variable phase compensator 13 is arranged at the input side of the serial compensator constituted by the PID compensator 12, and the gain tables 15 and 16 corresponding to the driving directions, i.e., the forward and reverse directions, of the stage 1 are arranged.

An improvement in control characteristics by the variable phase compensator 13 will be explained below.

Figure 2:
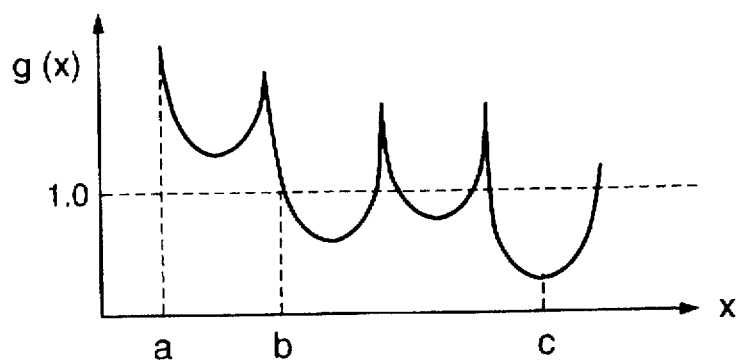
FIG. 2 is a graph showing an example of a gain table formed by a preliminary scan operation.

FIG. 2 shows an example of a gain table formed by a preliminary scan operation. In this example, a command signal u to be supplied to the linear motor in a preliminary scan operation is subjected to filter processing so as to cut high frequency noise components, and thereafter, the processed signal is multiplied by a predetermined bias value so that the expected value becomes 1. In FIG. 2, points a, b, and c respectively give the maximum value, the expected value (=1), and the minimum value of the gain table. Deviation nonuniformity caused by a thrust nonuniformity is generated upon switching coils or permanent magnets to be energized. Therefore, the deviation nonuniformity in a constant-speed scan operation has predetermined periodicity. This periodicity is represented by $\omega_g$. Note that $\omega_g$ is as low as several rad/sec.

Figure 3:
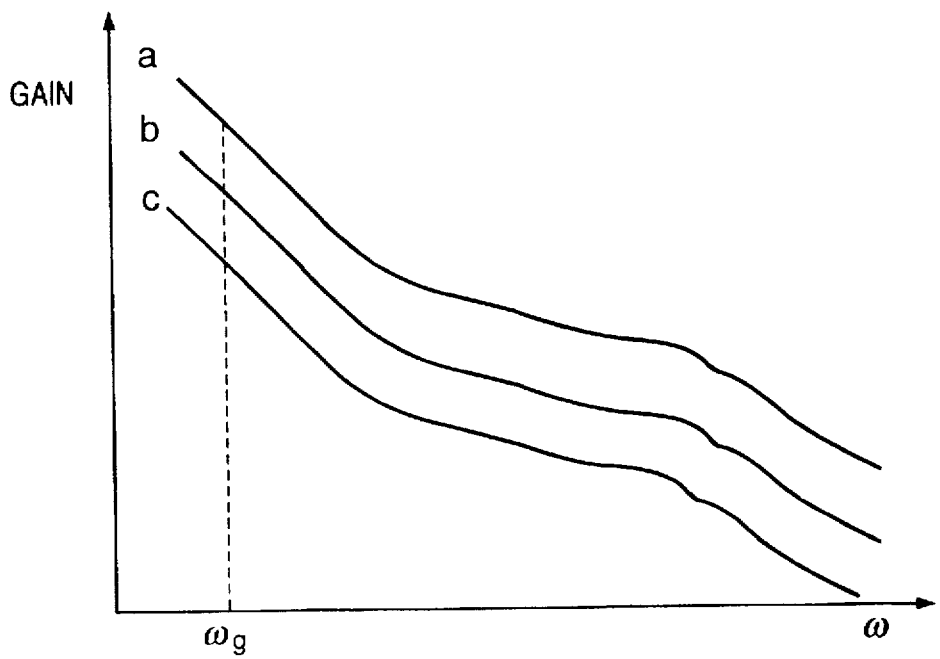
FIG. 3 is a graph showing the open-loop transfer characteristics of a general control system for correcting the control characteristics using a gain table.

FIG. 3 shows changes in gain of the open-loop transfer characteristics of the control system of the above-mentioned three points when the gains are changed by the conventional technique using the gain table shown in FIG. 2. As shown in FIG. 3, in the conventional technique, since the entire gain characteristics of the system change up and down, local characteristic variations of the control system become very large. Although the angular frequency of the deviation nonuniformity to be removed by the gain of the table is $\omega_g$, and is as low as several rad/sec, the characteristics in the high-frequency range are needlessly changed in the conventional technique.

In contrast to this, in this embodiment, in place of changing the gain of the entire system, the variable phase compensator 13 given by formula (2) below is added to the compensation system:

$$\frac{g(x)\omega_{lag} + s}{\omega_{lag} + s} \quad (2)$$

More specifically, the phase lead frequency is changed by the gain g(x) of the table. At this time, the variable phase compensator serves as a phase lead-lag compensator when g<1, or serves as a phase lag-lead compensator when g>1. In the formula (2), $\omega_{lag}$ indicates corner frequency.

Figure 4A:
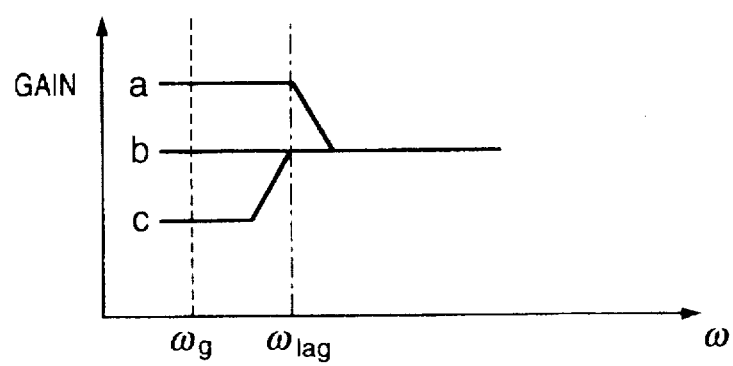
FIG. 4A is a graph showing the gain characteristics of a variable phase compensator according to the first embodiment.
Figure 4B:
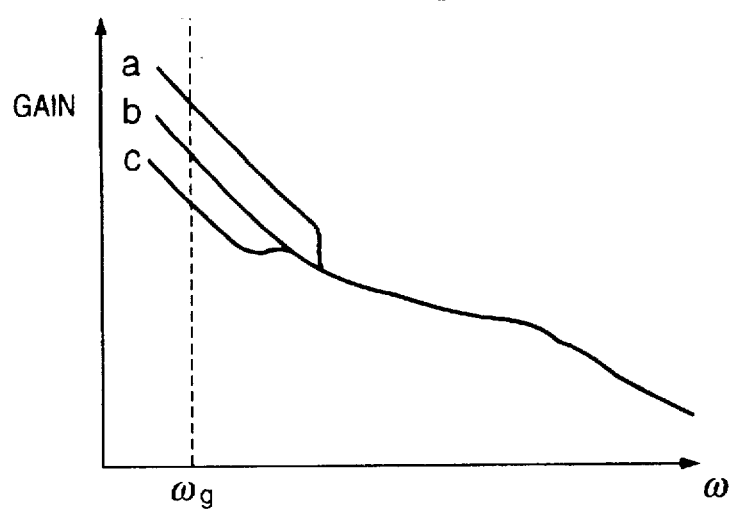
FIG. 4B is a graph showing the open-loop transfer characteristics according to the first embodiment.

FIG. 4A shows the gain characteristics of the variable phase compensator 13 at the above-mentioned three points. Although the gain in the low-frequency range including the angular frequency $\omega_g$ of the thrust nonuniformity is changed by the gain table, the gain in the high-frequency range is left unchanged. FIG. 4B shows the open-loop transfer characteristics of the control system when this variable phase compensator 13 is used. As shown in FIG. 4B, only the gain in the low-frequency range including the frequency $\omega_g$ of the thrust nonuniformity changes, and the characteristics in the high-frequency range are not influenced at all. Therefore, characteristic variations of the system due to the gain table can be minimized, and the deviation nonuniformity can also be suppressed.

The function of the memory units 15 and 16 corresponding to one of the characteristic arrangements of this embodiment will be described below. Prior to a scan operation, a preliminary scan operation is performed so as to form a gain table on the basis of the influence of the thrust nonuniformity. More specifically, the preliminary scan operation of the stage 1 is performed by assigning a target position $X_r$ so that a constant stage velocity is obtained in the entire movable region of the stage 1. At this time, the switches 17 and 18 are set at the p side.

First, a forward preliminary scan operation is performed. In this case, the switches 19 and 20 are set at the f side. At this time, the variable phase compensator 13 is set to be g $(x_m)=1$ to always yield 1. A control command signal u(t) in the forward scan operation obtained in this state and stage position information x(t) are supplied to the signal processing unit 14, and a table $u(x_m)$ using the stage position $x_m$ as an index is formed based on the two signal sequences. The signal processing unit 14 performs filter processing and normalization processing for the table $u(x_m)$, thus forming a forward gain table $g_f(x_m)$. This procedure for this process has already been described above with reference to FIG. 2. The gain table $g_f(X_m)$ is stored in the memory unit 15 corresponding to the forward feed direction.

Figure 5A:
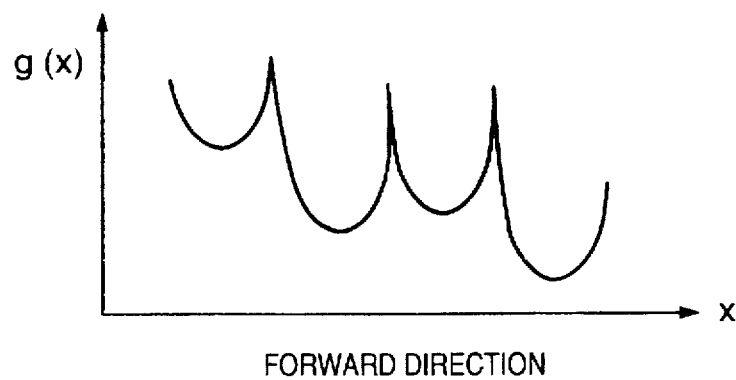
FIG. 5A is a graph showing the gain table for a forward feed operation.
Figure 5B:
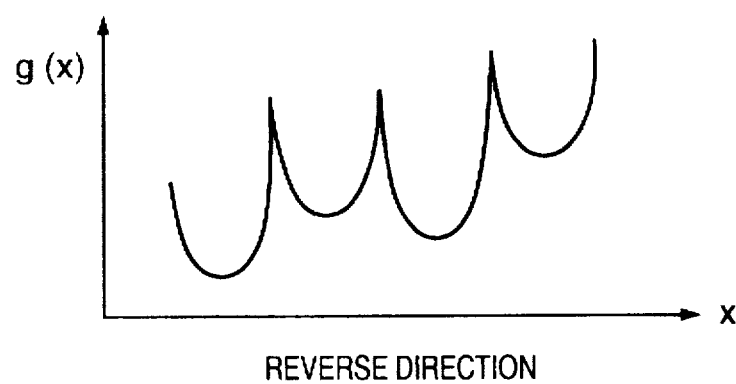
FIG. 5B is a graph showing the gain table for a reverse feed operation.

Similarly, the switches 19 and 20 are set at the r side, and a gain table $g_r(X_m)$ in a reverse scan operation is stored in the memory unit 16. FIGS. 5A and 5B respectively show the forward and reverse gain tables formed in this manner. As described above, since the trend of the gain table due to disturbances varies depending on the moving direction of the stage 1, when correction is performed using a single gain table like in the conventional technique, the control characteristics especially at the end portion of the stage movable range deteriorate, and such deterioration adversely influences the throughput. In contrast to this, since this embodiment has a plurality of tables depending on the stage position, such dependence on the feed direction of the gain table can be appropriately coped with.

After the forward and reverse gain tables are formed, the switches 17 and 18 are set at the s side, and a scan operation is performed. At this time, the switches 19 and 20 are switched to the f or r side depending on the feed direction. Then, tables values corresponding to the forward and reverse directions are looked up using the stage position $x_m$ as an index, and are transferred to the varying unit 22. The varying unit 22 changes the corner frequency of the variable phase compensator 13. In this embodiment, characteristic variations of the control system due to the table look-up operation can be minimized, and the deviation nonuniformity due to the thrust nonuniformity can be sufficiently removed, as has been described above with reference to FIGS. 2 and 3 and FIGS. 4A and 4B.

Note that such variable phase compensator 13 can be easily constituted when the compensator 13 is approximately implemented using a digital filter which is obtained by discrete approximation at a predetermined sampling period, and is mounted using a microprocessor.

As an example that shows the effect of this embodiment, FIGS. 6A and 6B illustrate unit step responses of the stage control system at the three points a, b, and c shown in FIG. 2. FIG. 6A shows unit step responses in the conventional technique, and characteristic variations of the control system are very large due to the influence of the gain table. Therefore, when scan control is performed in practice using the conventional technique, the settling time considerably deteriorates in some shots, resulting in a low throughput. In contrast to this, in this embodiment, as shown in FIG. 6B, characteristic variations of the control system due to a gain variation can be minimized, and a high throughput can be obtained.

Figure 21:
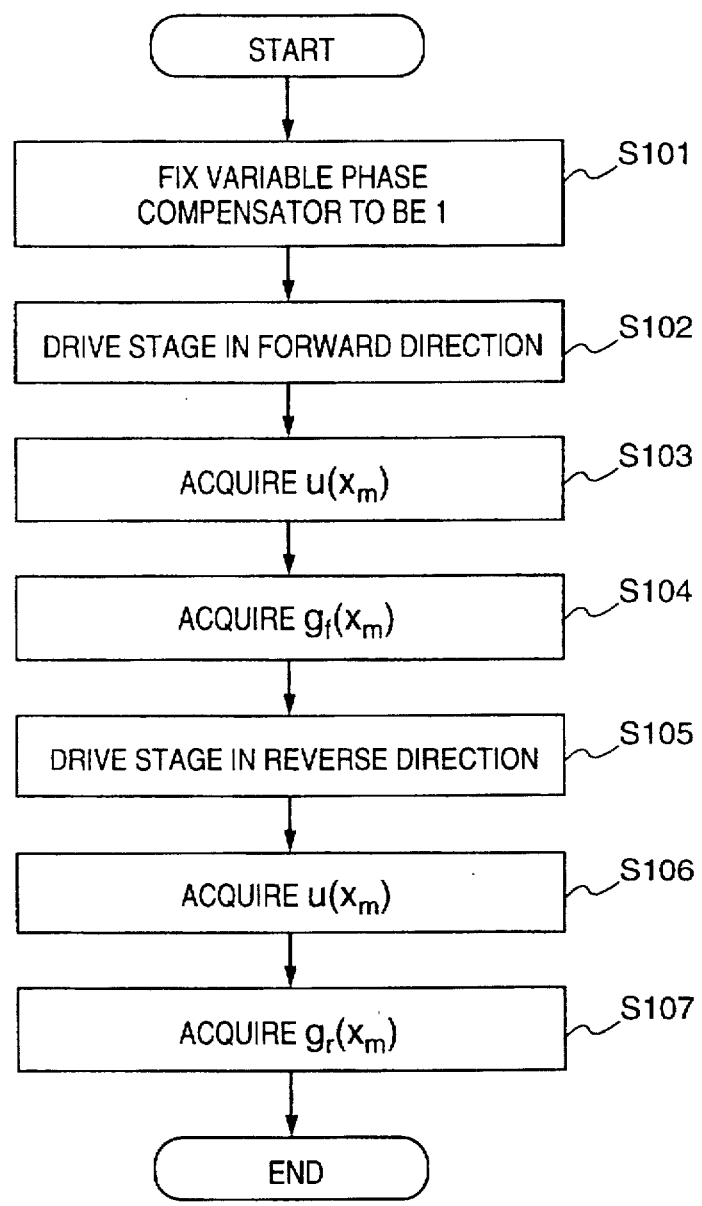
FIG. 21 is a flow chart showing the procedure for forming a gain table according to the first embodiment.
Figure 22:
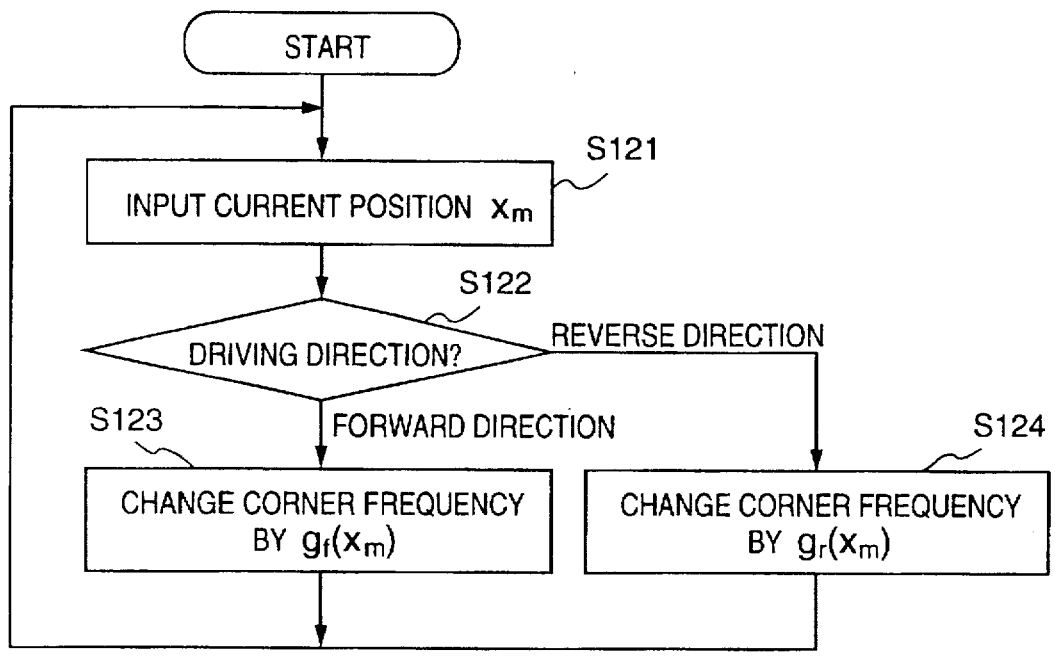
FIG. 22 is a flow chart for explaining the procedure upon table driving according to the first embodiment.

The operation of the first embodiment will be described in detail below with reference to the flow charts shown in FIGS. 21 and 22.

The procedure for forming the forward and reverse gain tables will be explained below. In step S101, the variable phase compensator 13 is fixed to be "1". At this time, the switches 17 and 18 are set at the p side. Subsequently, in step S102, the stage 1 is driven in the forward direction. Note that the switches 19 and 20 are set at the f side at this time, and a gain table is formed in the memory unit 15.

In step S103, the signal processing unit 14 acquires u at each position $x_m$, and acquires $u(X_m)$. The signal processing unit 14 performs filter processing and normalization processing for the obtained $u(X_m)$ to acquire $g_f(x_m)$, which is stored in the memory unit 15.

Upon forming the reverse gain table, the switches 19 and 20 are set at the r side, and the same processing as in steps S102 to S104 is performed (steps S105, S106, and S107).

When the stage 1 is driven using the gain tables obtained as described above, the procedure shown in FIG. 22 is executed. Note that the switches 17 and 18 are set at the s side. In step S121, the position information $x_m$ of the stage is fetched from the laser interferometer 9 upon driving the stage 1. Subsequently, in step S122, the current driving direction of the stage 1 is discriminated. If the driving direction is the forward direction, the flow advances to step S123. In step S123, the switches 19 and 20 are set at the f side, and the corner frequency is corrected using the table $g_f(X_m)$. On the other hand, if the driving direction is the reverse direction, the flow advances to step S124. In step S124, the switches 19 and 20 are set at the r side, and the corner frequency is corrected using the table $g_r(x_m)$.

Note that the switches 17, 18, 19, and 20 in the arrangement shown in FIG. 1 need only be automatically switched, and such function is normally realized using a microprocessor, although not shown in FIG. 1. In the above description, each gain table is formed to have an expected value=1. Therefore, in the above description, the variable phase compensator 13 can serve as both a phase lead-lag compensator and a phase lag-lead compensator. However, when the gain table g(x) is set so that its maximum value assumes "1", a phase lead-lag compensator is always constituted. Therefore, when only the gain in the low-frequency range is changed by the variable phase lead-lag compensator using the gain table normalized by g<1, the phase compensation of the control system can be increased. That is, the stability of the control system can be improved by the variable phase lead-lag compensator.

Furthermore, in the description of the above embodiment, the control system of the wafer stage in the scan type exposure apparatus has been exemplified. However, the present invention can be similarly applied to any other apparatuses that require constant-velocity control with high precision, e.g., removal of cogging nonuniformity of a motor in constant-speed control of an image scanner or a copying machine, independently of 1-input/output systems or multi-input/output systems. In this embodiment, the compensation system is constituted by a normal serial compensator using a PID compensator and a variable phase compensator. However, the serial compensator is not limited to the PID compensator, and the compensation system may be constituted using any other serial compensators. Also, the present invention can be applied to any state quantities such as a displacement, velocity, and the like of the controlled object.

In the above embodiment, the compensation system is constituted by two compensators, i.e., a normal serial compensator and a variable phase compensator. Instead, a portion of the normal serial compensator may directly constitute the variable phase compensator. In this case, a compensation system of a lower order can be constituted.

Furthermore, in the above description, the present invention is applied to the control system including only a serial compensator, i.e., a so-called single-degree-freedom control system. However, the present invention is not limited to this. For example, the present invention can be similarly applied to a two-degree-freedom control system, e.g., a control system having a feedforward system.

As described above, according to the present invention, since the variable phase compensation is adopted, a control apparatus which can realize good control performance in the entire movable region of the controlled object while suppressing characteristic variations of the control system, and can remove the deviation nonuniformity, even when variations due to a gain table or function are large by changing the time constant using the gain table and/or the function so as to remove deviation nonuniformity due to thrust nonuniformity of driving elements, can be realized.

Since the gain tables and/or functions corresponding to the moving directions are provided so as to cope with disturbances depending on the feed direction of the controlled object, good control performance can be realized independently of the feed direction.

[Second Embodiment]

Figure 7:
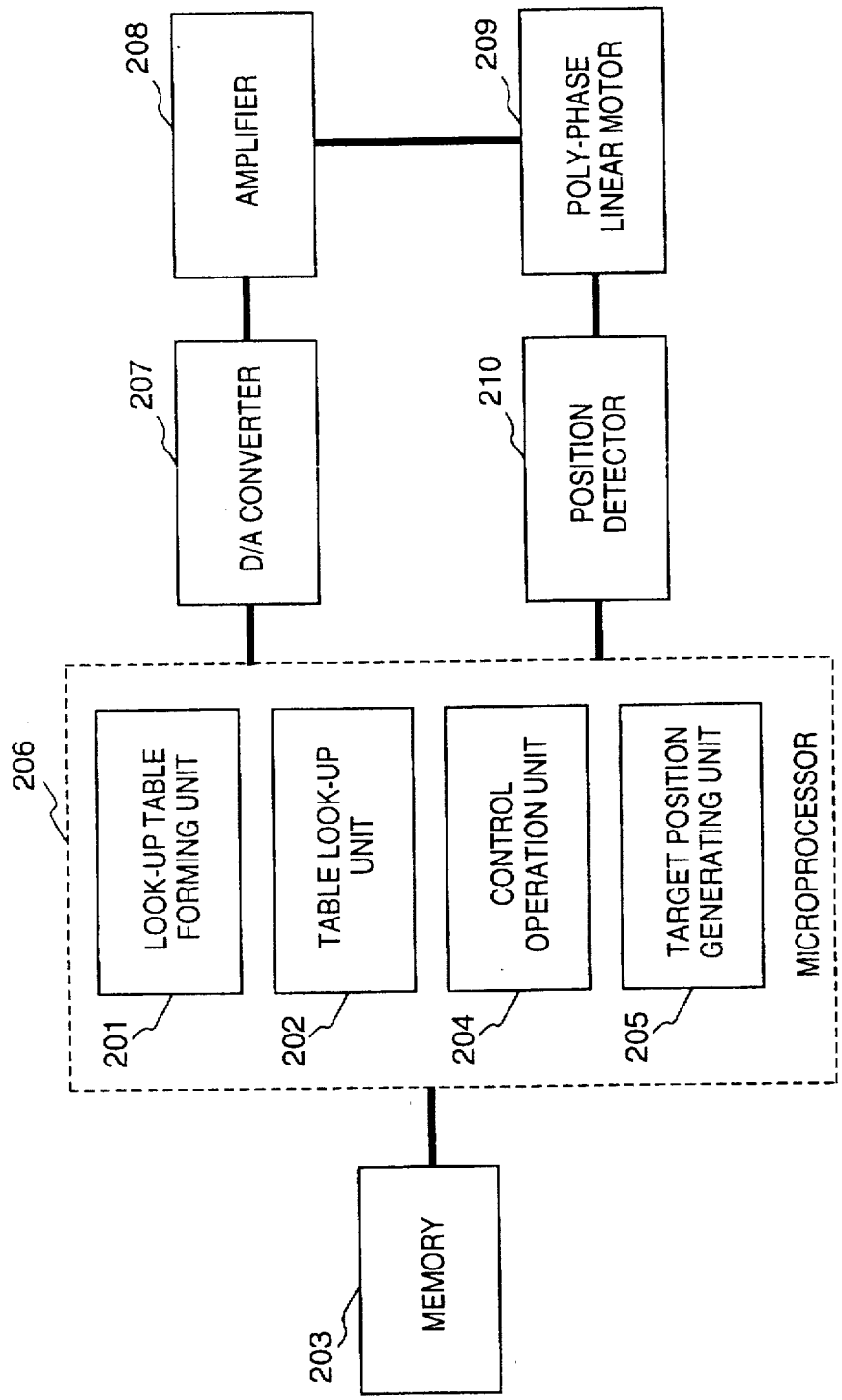
FIG. 7 is a block diagram showing the arrangement of a poly-phase linear motor control apparatus according to the second embodiment of the present invention.

FIG. 7 shows the arrangement of a poly-phase linear motor control apparatus according to the second embodiment of the present invention. Referring to FIG. 7, reference numeral 201 denotes a look-up table forming unit; and 202, a table look-up unit. Reference numeral 203 denotes a memory serving as a look-up table storing unit; 204, a control operation unit; and 205, a target position generating unit. The look-up table forming unit 201, the table look-up unit 202, the control operation unit 204, and the target position generating unit 205 are realized by a microprocessor 206 such as a CPU, DSP, or the like. A D/A converter 207 receives a command value from the microprocessor 206, converts it into an analog signal, and supplies the analog signal to an amplifier 208. In the amplifier, a current control loop is constituted, and hence, the amplifier 208 serves as a current mode amplifier. A poly-phase linear motor 209 is driven by the amplifier 208, and the position of an object to be driven is detected by a position detector 210. The poly-phase linear motor 209 has the same arrangement as that shown in FIGS. 18A to 18G used in the description of the prior art. In this embodiment, the position detector 210 comprises a laser interferometer, but may comprise a linear encoder or the like.

The control operation unit 204 performs a control compensation operation such as a PID operation using position information output from the position detector 210, and supplies the operation result to the D/A converter 207 as a current command value, thus constituting a feedback loop for performing position control.

The operation of the look-up table forming unit 201 will be described below with reference to the flow chart shown in FIG. 8.

A movable element of the poly-phase linear motor is moved at a constant velocity to a first position in accordance with a target value generated by the target position generating unit 205 (step S201). The movable member is driven to a second position by applying the same target value pattern as that used for actually driving the poly-phase linear motor (steps S202 and S203). At this time, the microprocessor 206 stores positions $P_n$ of the movable member and the differences between the target positions and the actual positions of the movable member, i.e., control deviations $E_n$, in the memory 203 at predetermined periods (1 msec) (step S202). Upon completion of movement to the second position, the storage operation in the memory ends.

The positions and the control deviations stored in the memory 3 normally include high-frequency components represented by external noise. Including such high-frequency components in a table is not preferable since the control system is forced to perform an insignificant operation. In some cases, the operation of the control system may become unstable. Therefore, in this embodiment, the high-frequency components are removed using a high-frequency cutoff type linear phase filter (steps S204 to S206). The cutoff frequency of the filter is set to be lower than the lower limit of the control frequency band estimated from parameters of a control compensator included in the control operation unit 204. In this embodiment, a 50th-order FIR filter given by equation (3) below is used, and its cutoff frequency is set to be 20 Hz.

$$y_n = \sum_{i=0}^{50} f_i x_{n-i} \quad (3)$$

where y is the output from the filter, x is the input time sequence of the filter, f is a coefficient of the filter, and n is time. The positions $P_n$ and the control deviations $E_n$ are subjected to the above-mentioned filter processing to obtain a position time sequence $PF_n$ and a control deviation time sequence $EF_n$.

Subsequently, the relationship between the position of the movable member of the poly-phase linear motor and the control deviation is formed as a table. Values in the position time sequence $PF_n$ subjected to the filter processing are checked one by one in turn, and every time the value increases by one unit ($\delta$), the value in the control deviation time sequence $EF_n$ is extracted and determined as a look-up table value (steps S207 to S209). Note that one unit $\delta$ represents the resolution (pitch) of the look-up table, and is set to be 0.1 mm in this embodiment. However, one unit $\delta$ may be set to be sufficiently small as long as the memory capacity allows.

A look-up table $K_m$ obtained by the processing performed so far is stored in the memory 203, and is looked up by the table look-up unit 202 as needed. The table look-up unit 202 will be described below. Upon execution of actual operations such as velocity control, alignment, and the like by driving the poly-phase linear motor, the table look-up unit 202 looks up the table in accordance with a rule represented by equations (4) below on the basis of position information p obtained by the position detector 210, thus obtaining a correction value k at that position.

$$k = K_L, L = p/\delta \quad (4)$$

More specifically, the position information p obtained by the position detector 210 is converted into a value an integer multiple of the pitch $\delta$ of the table, and the converted value is used as an offset (index L) from the beginning of the look-up table in the memory, thereby obtaining a correction value k corresponding to the current position.

The obtained correction value k is added to the calculation result of the control deviation in the control operation unit 204, and thereafter, the compensation calculation result such as PID calculation result is input as a manipulated variable, i.e., a control input to the D/A converter 207, thus driving the poly-phase linear motor.

Figure 9:
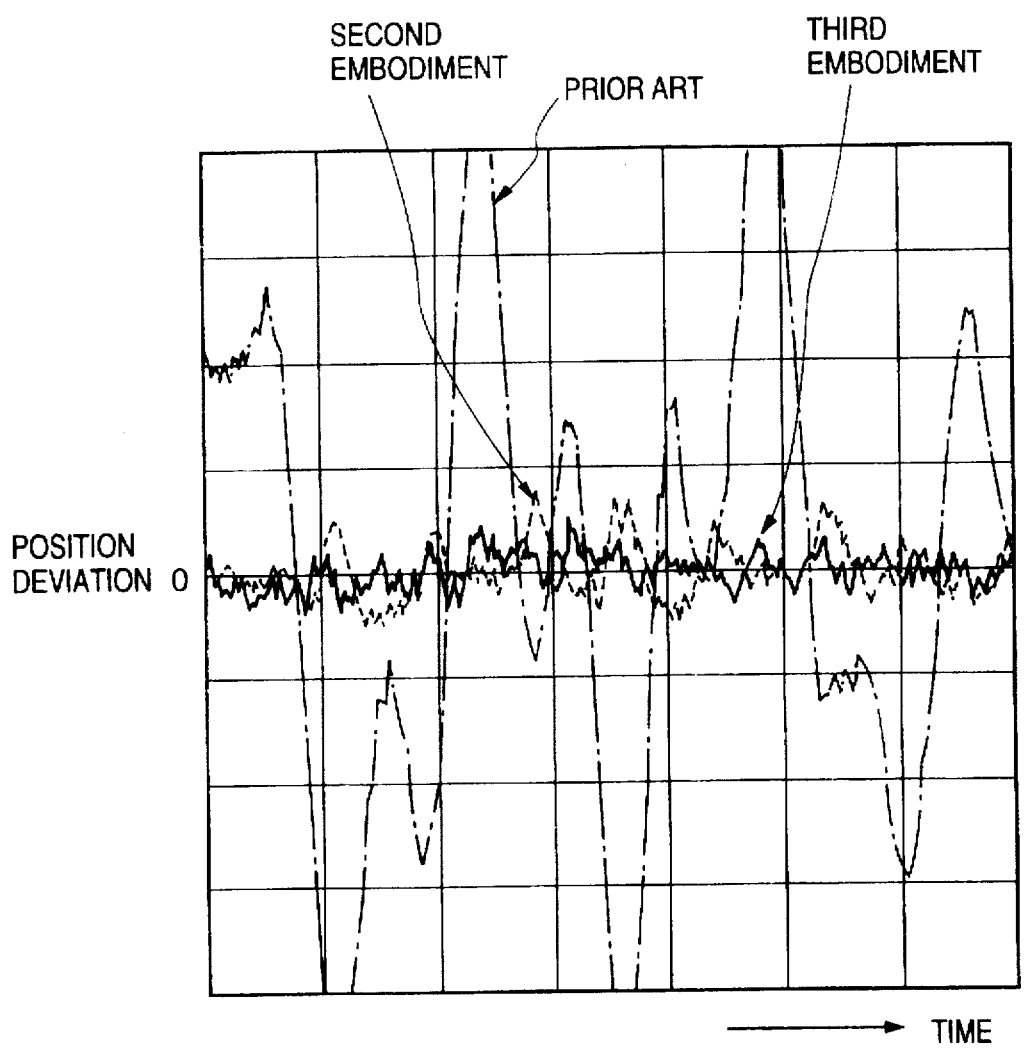
FIG. 9 is a graph for explaining the effects of the second and third embodiments.

FIG. 9 shows the position deviation in a steady state upon performing a constant-velocity driving operation in the system shown in FIG. 7, as compared to that in the prior art, so as to show the effect of the present invention. Referring to FIG. 9, the position deviation caused by a conventional poly-phase linear motor driving apparatus is indicated by a dotted curve, and the position deviation caused by the present invention is indicated by a broken curve. As can be seen from FIG. 9, the position deviation is suppressed by the present invention.

In this embodiment, the position control has been exemplified. However, as can be seen from the above description, since velocity control can be realized by the same technique, a detailed description thereof will be omitted.

Figure 23:
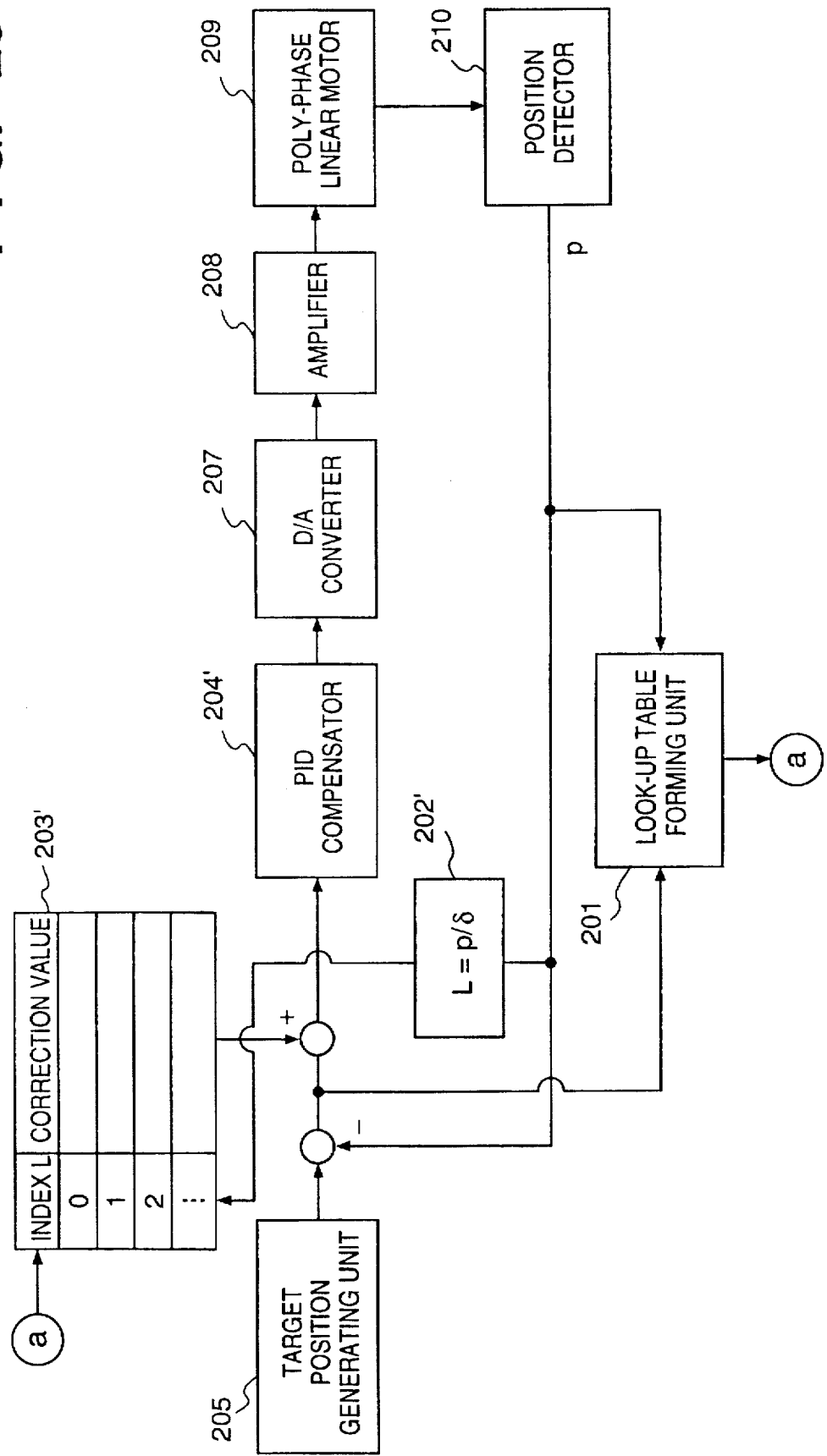
FIG. 23 is a block diagram showing the control arrangement of a poly-phase linear motor control apparatus according to the second embodiment.

FIG. 23 is a block diagram showing the control arrangement of a poly-phase linear motor according to the second embodiment of the present invention. Referring to FIG. 23, reference numeral 203' denotes a look-up table stored in the memory 203. Reference numeral 202' denotes an index calculation unit included in the table look-up unit 202. The index calculation unit 202' calculates an index L on the basis of position information p supplied from the position detector 210 and the unit $\delta$ of the look-up table 203'. A correction value stored at an address corresponding to the index L is read out from the look-up table 203', and is added to the control deviation.

Upon forming a look-up table, the look-up table forming unit 201 generates correction values in the above-mentioned sequence, and registers them in the look-up table. Note that the correction value input from the look-up table 203' is fixed to be zero upon forming a look-up table.

[Third Embodiment]

Figure 8:
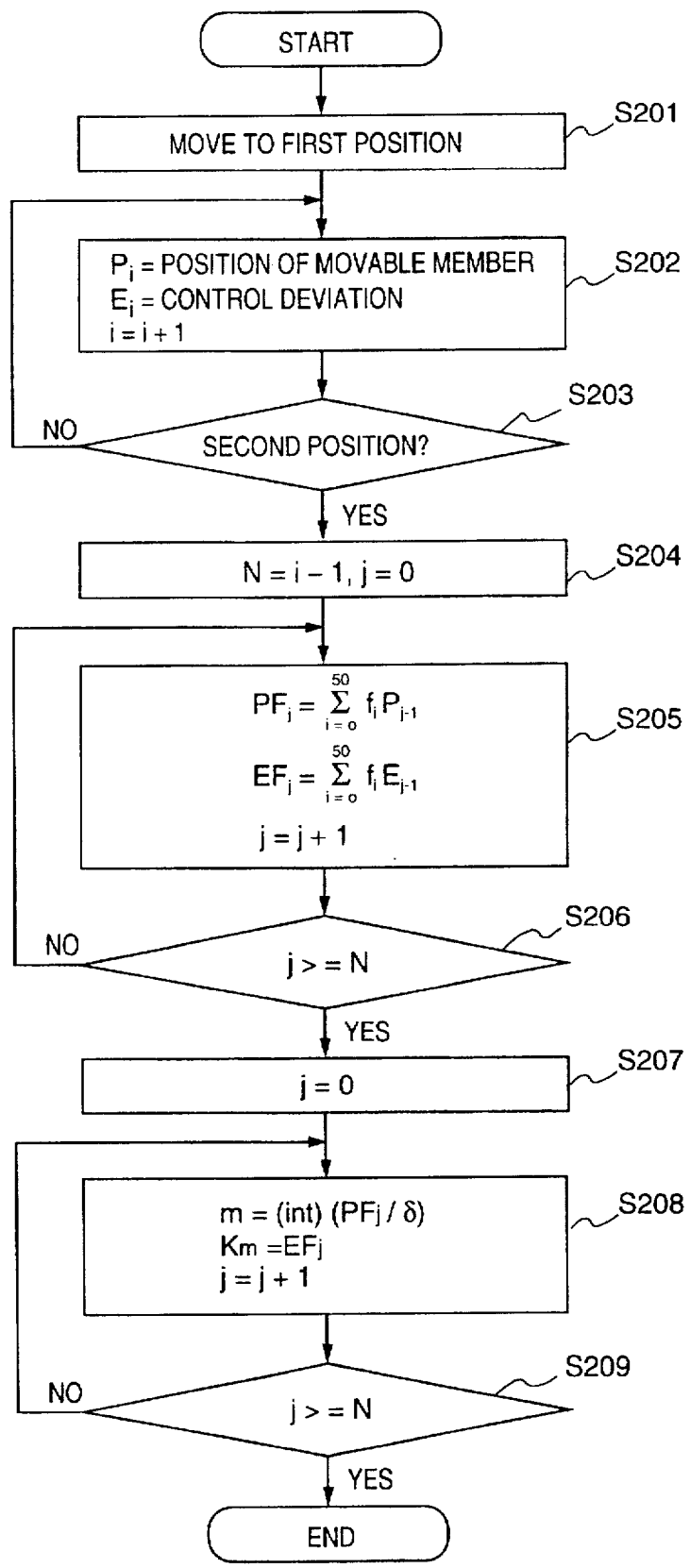
FIG. 8 is a flow chart for explaining the procedure for forming a look-up table according to the second embodiment of the present invention.
Figure 10:
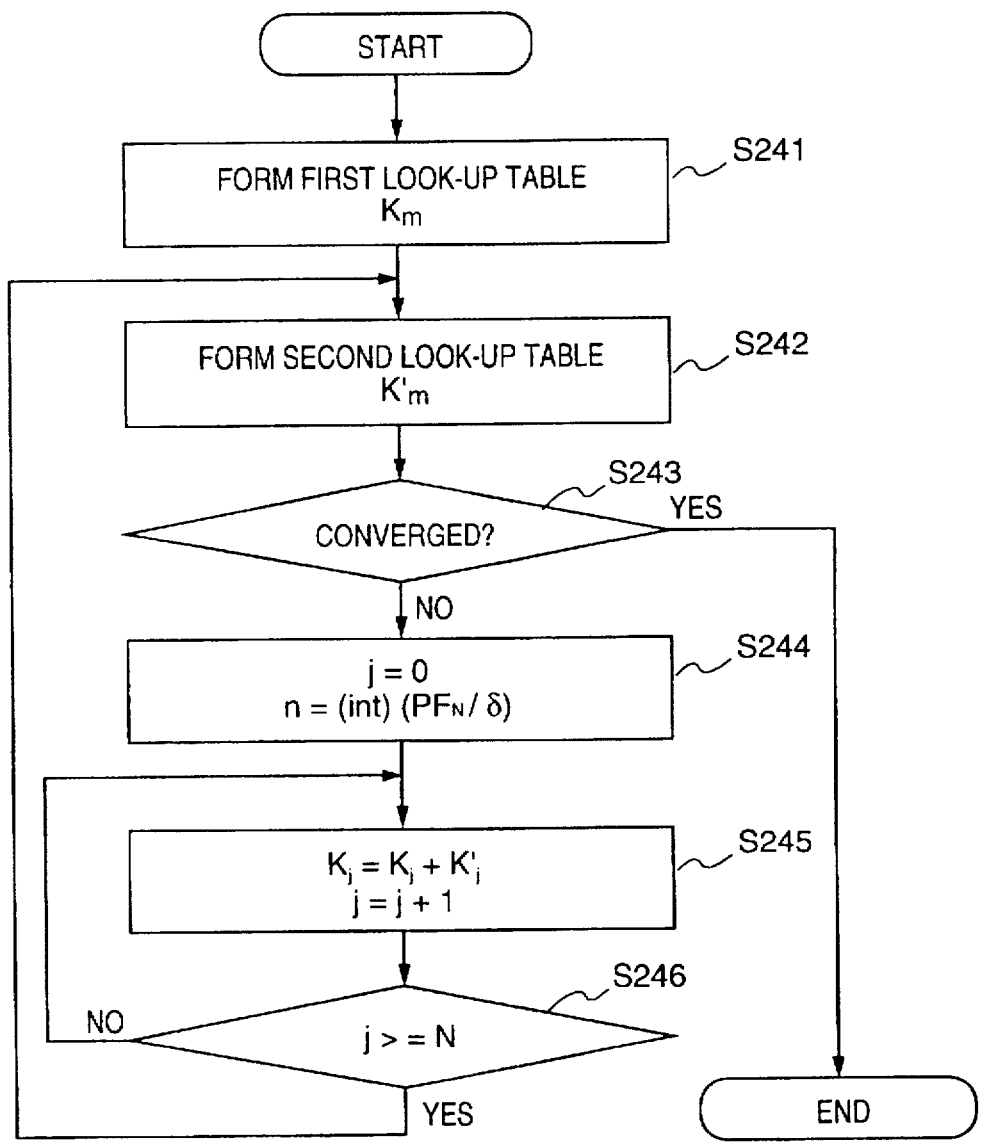
FIG. 10 is a flow chart for explaining the procedure for forming a look-up table according to the third embodiment of the present invention.
Figure 11:
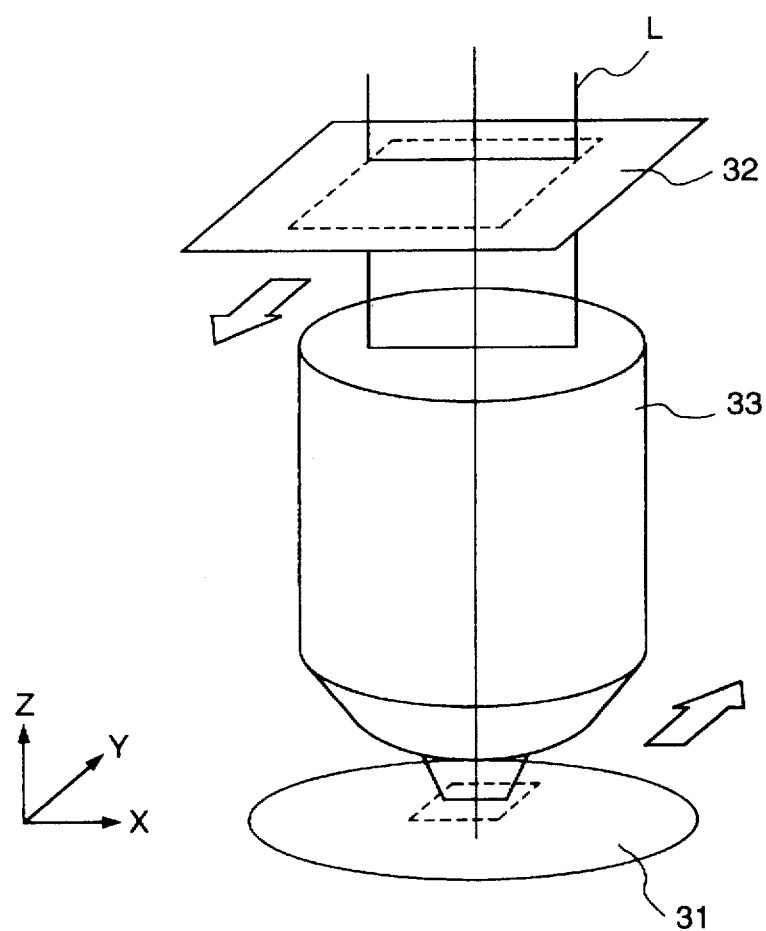
FIG. 11 is a perspective view showing a synchronous scan type reduction production exposure apparatus.
Figure 12:
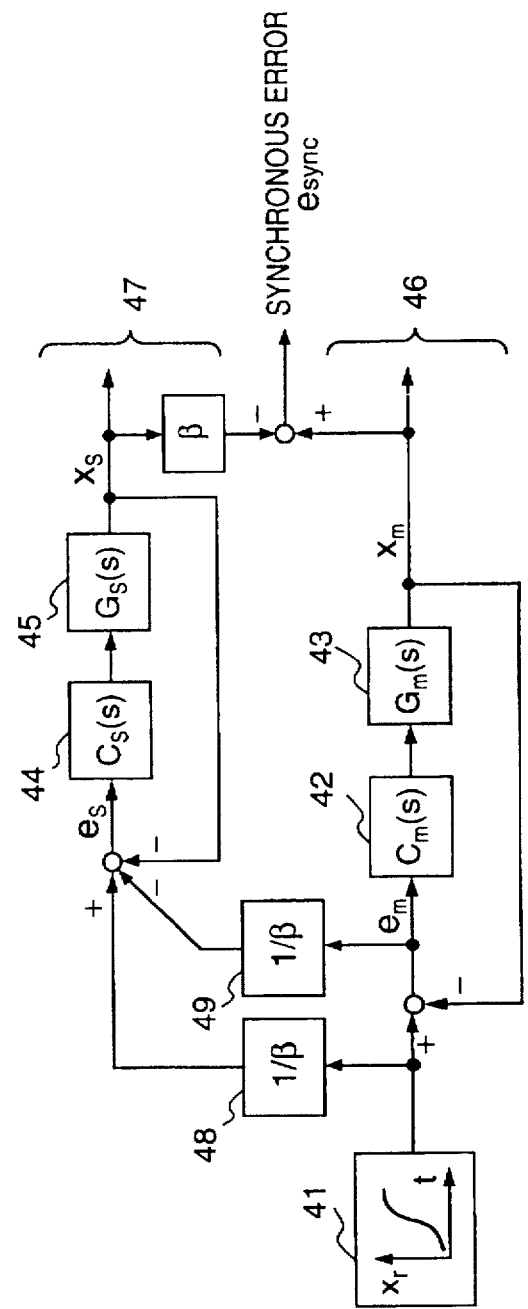
FIG. 12 is a block diagram showing a control system of the apparatus shown in FIG. 11.
Figure 13:
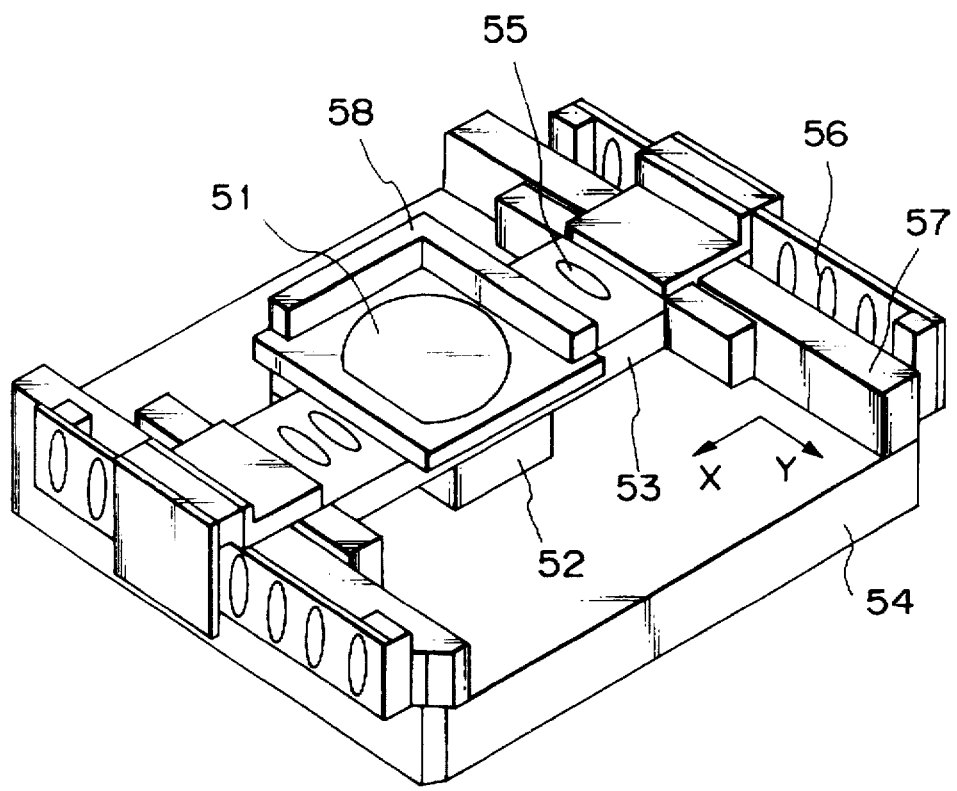
FIG. 13 is a perspective view showing the arrangement of a non-contact movement type stage using a moving magnet type linear motor.
Figure 16A:
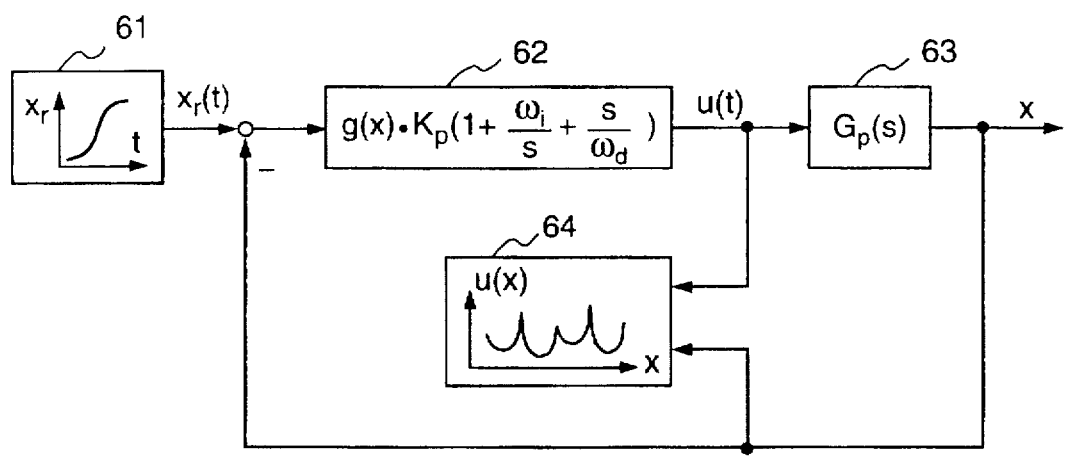
FIGS. 16A and 16B are block diagrams showing the control arrangement of a general control apparatus.
Figure 16B:
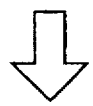
Figure 16B:
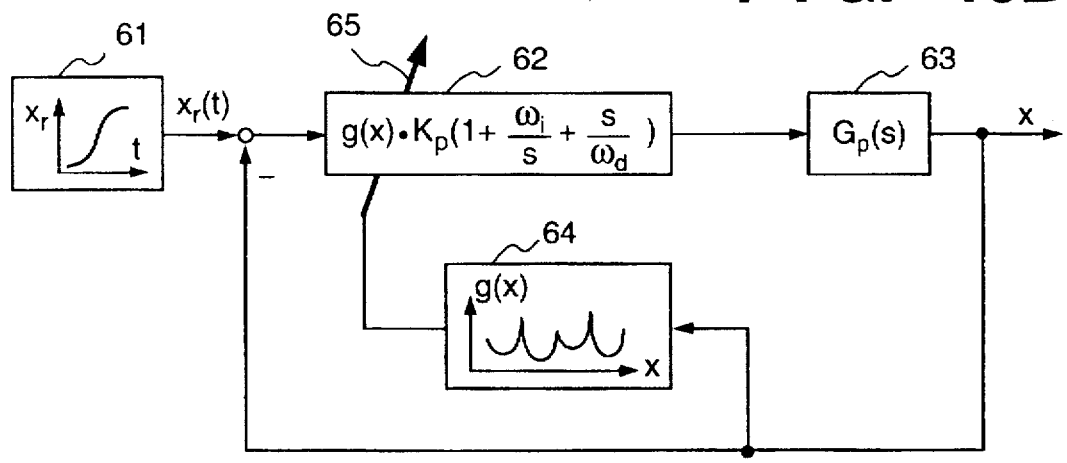
Figure 17:
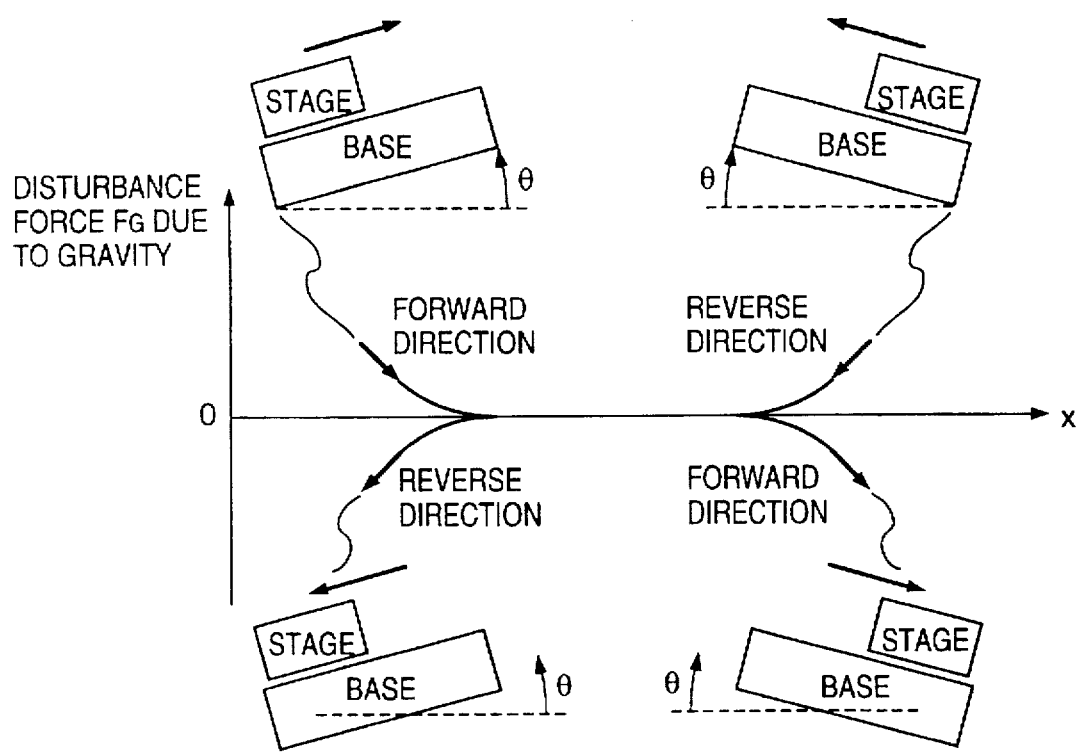
FIG. 17 is a graph showing the disturbance force on a stage due to gravity.
Figure 18A:
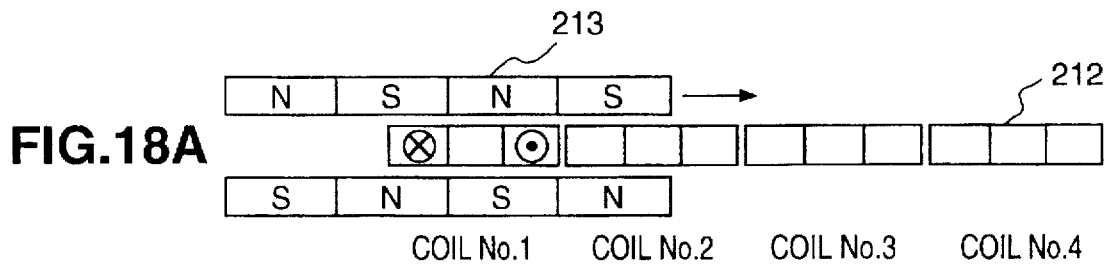
FIGS. 18A to 18G are views for explaining the poly-phase linear motor.
Figure 18B:
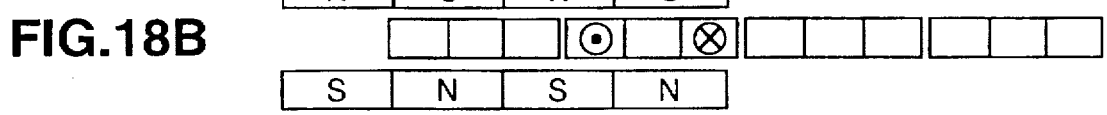
Figure 18C:
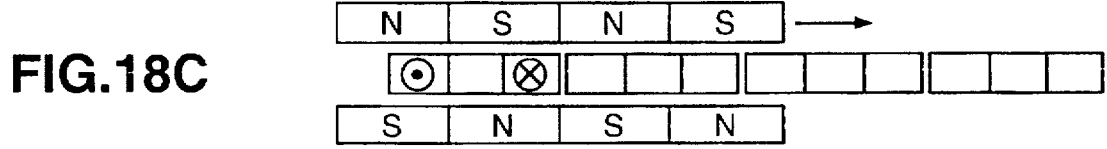
Figure 18D:
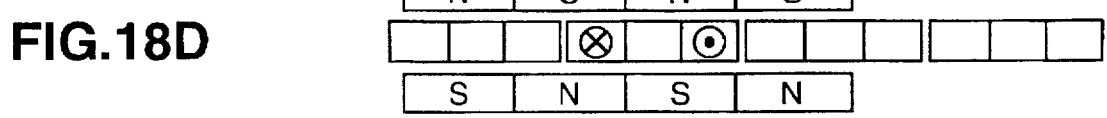
Figure 18E:
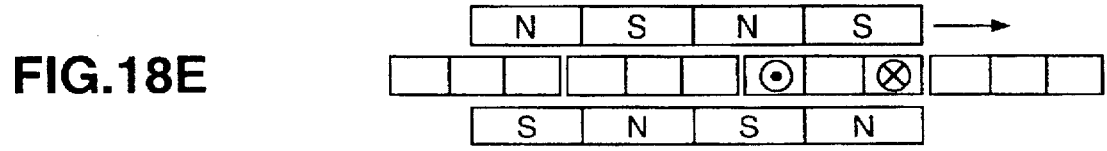
Figure 18F:
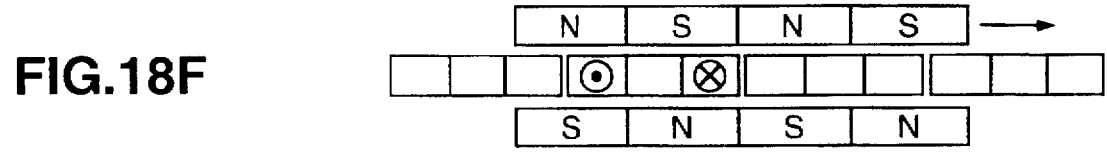
Figure 18G:
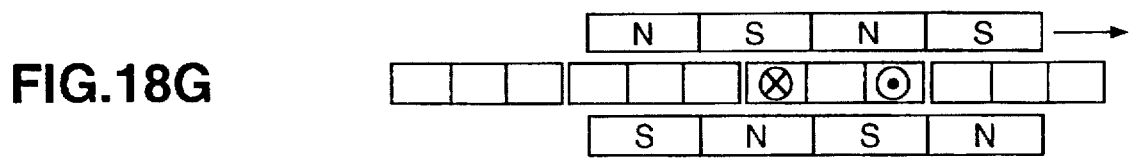
Figure 19:
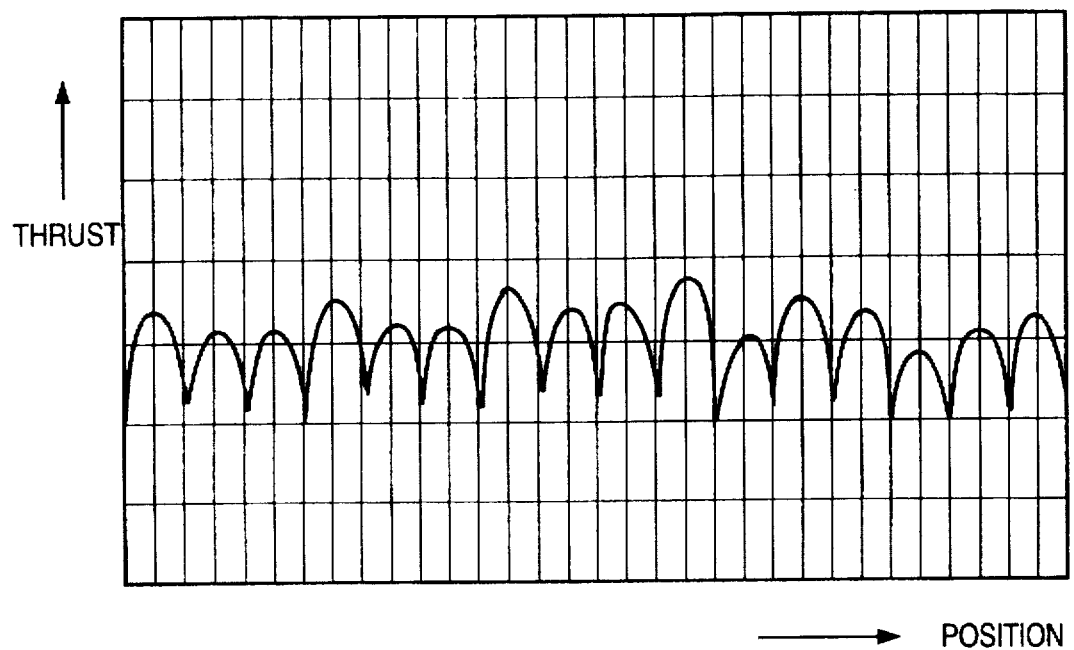
FIG. 19 is a graph showing the thrust variation in the poly-phase linear motor.
Figure 20:
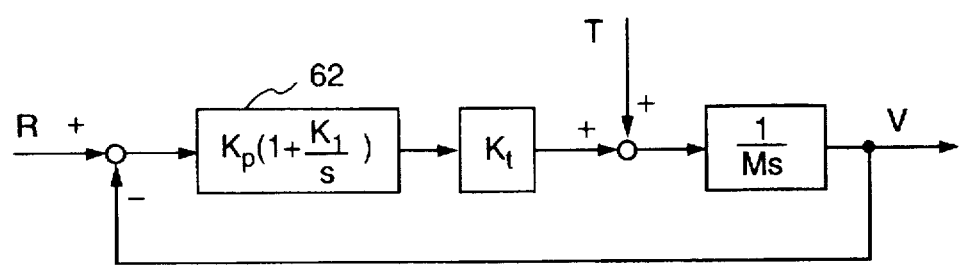
FIG. 20 is a block diagram for explaining a general control system for the poly-phase linear motor.

As described in the second embodiment, the look-up table is formed in accordance with the flow chart shown in FIG. 8. By repeating this procedure, the position deviation suppression performance can be further improved. FIG. 10 is a flow chart showing this procedure.

Referring to FIG. 10, a first look-up table $K_m$ is formed in accordance with the flow chart shown in FIG. 8 (step S241). As described in the second embodiment, a value obtained from the first look-up table $K_m$ is added to the control deviation to drive the motor. At this time, a second look-up table $K'_m$ is formed in accordance with the flow chart shown in FIG. 8 (step S242), and is added to the first look-up table $K_m$ in units of elements to obtain a new look-up table (steps S244 to S246). By repeating this processing (step S243), information which cannot be reflected in a table obtained by the N-th correction can be reflected in a table obtained by the (N+1)-th correction, and the position deviation suppression performance can be further improved.

In order to demonstrate the position deviation suppression effect of this embodiment, FIG. 9 above also shows the position deviation waveform (solid curve) obtained when the table correction is performed three times. As can be seen from FIG. 9, the position deviation is further suppressed to ½ that obtained when no table correction is performed.

In the second and third embodiments, the memory 203 such as a RAM or the like is used as the look-up table storing unit. For example, the look-up table may be stored in a medium such as a magnetic disk or the like. Once the look-up table is formed, it need not be repetitively formed unless the characteristics of a mechanical system change.

Therefore, the look-up table is loaded only once from the medium such as a magnetic disk that stores the look-up table upon starting up an equipment, and can be stored in, e.g., a RAM. After the poly-phase linear motor is driven over a long term, the look-up table may be automatically re-formed, thus correcting aging of the mechanical system.

As described above, according to the second and third embodiments, a poly-phase linear motor driving apparatus which can sufficiently remove thrust variations of a poly-phase linear motor in a system using the poly-phase linear motor can be provided.

As many apparently widely different embodiments of the present invention can be made without departing from the spirit and scope thereof, it is to be understood that the invention is not limited to the specific embodiments thereof except as defined in the appended claims.

What is claimed is:

1. A driving control apparatus comprising:

generation means for generating a target state quantity for a controlled object;

detection means for detecting a current state quantity of the controlled object;

control means for controlling a driving operation of the controlled object on the basis of the target state quantity generated by said generation means and the state quantity detected by said detection means;

storage means for storing adjustment information for adjusting the driving operation by said control means in correspondence with the state quantity of the controlled object in units of operation states of the controlled object; and adjustment means for acquiring adjustment information from said storage means on the basis of the operation state and the state quantity of the controlled object and adjusting phase compensation of said control means by changing a corner frequency of the phase compensation on the basis of the acquired adjustment information.

2. The apparatus according to claim 1, wherein the adjustment information is a function using the state quantity of the controlled object as a variable.

3. The apparatus according to claim 1, wherein the adjustment information is a table that registers adjustment quantities corresponding to each respective state quantities of the controlled object.

4. The apparatus according to claim 1, wherein the state quantity is position information associated with the controlled object, and the operation state is an operating direction of the controlled object.

5. The apparatus according to claim 1, wherein the state quantity is moving velocity information associated with the controlled object, and the operation state is an operating direction of the controlled object.

6. The apparatus according to claim 1, further comprising adjustment information generation means for acquiring a relationship between the state quantity of the controlled object and a controlled quantity of said control means in a state wherein adjustment by said adjustment means is inhibited, and generating the adjustment information on the basis of the acquired relationship and the operation state at that time.

7. The apparatus according to claim 6, wherein the state quantity is position information associated with the controlled object, and the operation state is an operating direction of the controlled object.

8. The apparatus according to claim 6, wherein the state quantity is moving velocity information associated with the controlled object, and the operation state is an operating direction of the controlled object.

9. A driving control apparatus comprising:

generation means for generating a target state quantity for a controlled object detection means for detecting a current state quantity of the controlled object;

control means for controlling a driving operation of the controlled object on the basis of the target state quantity generated by said generation means and the state quantity detected by said detection means; and adjustment means for acquiring adjustment information on the basis of the state quantity of the controlled object and adjusting phase compensation of driving control by said control means by changing a corner frequency of the phase compensation on the basis of the acquired adjustment information.

10. The apparatus according to claim 9, further comprising adjustment information generation means for acquiring a relationship between the state quantity of the controlled object and a controlled quantity of said control means in a state wherein adjustment by said adjustment means is inhibited, and generating the adjustment information on the basis of the acquired relationship.

11. A driving control apparatus for a linear motor which selectively switches coils to be energized in correspondence with a position of a movable member; comprising:

holding means for holding a look-up table registering correction information corresponding to each position of the movable member in the linear motor;

correction means for correcting a control deviation obtained by feeding back a state quantity of the movable member to a control target state quantity on the basis of the correction information obtained from the look-up table;

control means for controlling a driving operation of the linear motor on the basis of the control deviation corrected by said correction means;

acquisition means for driving the linear motor and acquiring positions of the movable member and the control deviations as time sequence data while correction by said correction means is inhibited; and generation means for generating the look-up table which registers control deviations corresponding to the positions of the movable member on the basis of a result obtained by removing high-frequency components from the time sequence data.

12. The apparatus according to claim 11, wherein the high-frequency components are removed from the time sequence data by said generation means using a high-frequency cutoff type linear phase filter, and a cutoff frequency of said filter is set to be lower than a lower limit of a control frequency range of a feedback system.

13. The apparatus according to claim 11, wherein said holding means holds a first look-up table which registers correction information corresponding to each position of the movable member in the linear motor, and said apparatus further comprises:

generation means for generating a second look-up table on the basis of time sequence data of control deviations and positions of the movable member obtained as a result of control by said control means; and look-up table correction means for correcting the first look-up table on the basis of the second look-up table.

14. The apparatus according to claim 13, wherein said holding means holds the first look-up table obtained by repeating correction by said correction means a plurality of number of times.

15. A driving control method for an apparatus which comprises storage means for storing adjustment information for adjusting driving control of a controlled object in accordance with a state quantity of the controlled object, in units of operation states of the controlled object, comprising:

the generation step of generating a target state quantity for a controlled object;

the detection step of detecting a current state quantity of the controlled object;

the control step of controlling a driving operation of the controlled object on the basis of the target state quantity generated in the generation step and the state quantity detected in the detection step; and the adjustment step of acquiring adjustment information from the storage means on the basis of the operation state and the state quantity of the controlled object and adjusting phase compensation in the control step by changing a corner frequency of the phase compensation on the basis of the acquired adjustment information.

16. The method according to claim 15, wherein the adjustment information is a function using the state quantity of the controlled object as a variable.

17. The method according to claim 15, wherein the adjustment information is a table that registers adjustment quantities corresponding to each respective state quantities of the controlled object.

18. The method according to claim 15, wherein the state quantity is position information associated with the controlled object, and the operation state is an operating direction of the controlled object.

19. The method according to claim 15, wherein the state quantity is moving velocity information associated with the controlled object, and the operation state is an operating direction of the controlled object.

20. The method according to claim 15, further comprising the adjustment information generation step of acquiring a relationship between the state quantity of the controlled object and a controlled quantity in the control step in a state wherein adjustment in the adjustment step is inhibited, and generating the adjustment information on the basis of the acquired relationship and the operation state at that time.

21. The method according to claim 20, wherein the state quantity is position information associated with the controlled object, and the operation state is an operating direction of the controlled object.

22. The method according to claim 20, wherein the state quantity is moving velocity information associated with the controlled object, and the operation state is an operating direction of the controlled object.

23. A driving control method comprising:

the generation step of generating a target state quantity for a controlled object;

the detection step of detecting a current state quantity of the controlled object;

the control step of controlling a driving operation of the controlled object on the basis of the target state quantity generated in the generation step and the state quantity detected in the detection step; and the adjustment step of acquiring adjustment information on the basis of the state quantity of the controlled object and adjusting phase compensation of driving control in the control step by changing a corner frequency of the phase compensation on the basis of the acquired adjustment information.

24. The method according to claim 23, further comprising the adjustment information generation step of acquiring a relationship between the state quantity of the controlled object and a controlled quantity in the control step in a state wherein adjustment in the adjustment step is inhibited, and generating the adjustment information on the basis of the acquired relationship.

25. A driving control method for a driving control apparatus for a linear motor which comprises holding means for holding a look-up table registering correction information corresponding to each position of a movable member of the linear motor and selectively switches coils to be energized in correspondence with a position of the movable member, comprising:

the first acquisition step of acquiring corresponding correction information from the holding means on the basis of a position of the movable member;

the correction step of correcting a control deviation obtained by feeding back a state quantity of the movable member to a control target state quantity on the basis of the correction information obtained from the look-up table;

the control step of controlling a driving operation of the linear motor on the basis of the control deviation corrected in the correction step;

the second acquisition step of driving the linear motor and acquiring positions of the movable member and the control deviations as time sequence data while correction in said correction step is inhibited; and the generation step of generating the look-up table which registers control deviations corresponding to the positions of the movable member on the basis of a result obtained by removing high-frequency components from the time sequence data.

26. The method according to claim 25, wherein the high-frequency components are removed from the time sequence data in the generation step using a high-frequency cutoff type linear phase filter, and a cutoff frequency of said filter is set to be lower than a lower limit of a control frequency range of a feedback system.

27. The method according to claim 25, wherein the holding means holds a first look-up table which registers correction information corresponding to each position of the movable member in the linear motor, and said method further comprises:

the second generation step of generating a second look-up table on the basis of time sequence data of control deviations and positions of the movable member obtained as a result of control in the control step; and the look-up table correction step of correcting the first look-up table on the basis of the second look-up table.

28. The method according to claim 27, wherein the holding means holds the first look-up table obtained by repeating correction in the correction step a plurality of number of times.

29. The apparatus according to claim 9, wherein the state quantity is position information associated with the controlled object.

30. The apparatus according to claim 9, wherein the state quantity is velocity information associated with the controlled object.

31. The method according to claim 23, wherein the state quantity is position information associated with the controlled object.

32. The method according to claim 23, wherein the state quantity is velocity information associated with the controlled object.

* * * * *

UNITED STATES PATENT AND TRADEMARK OFFICE
CERTIFICATE OF CORRECTION

PATENT NO. : 5,757,149

DATED : May 26, 1998

INVENTOR(S) : MIKIO SATO, ET AL.

It is certified that error appears in the above-identified patent and that said Letters Patent is hereby corrected as shown below:

COLUMN 1:

Line 18, "about nm" should read --about 10 nm--.

COLUMN 4:

Line 50, "$\hat{x}$ and $\hat{\cdot}$" should read --$\otimes$ and $\odot$--.

COLUMN 16:

Line 5, "object" should read --object;-- and
Line 27, "member;" should read --member,--.

Signed and Sealed this

Eleventh Day of May, 1999

Attest:

Q. TODD DICKINSON

*Attesting Officer*  *Acting Commissioner of Patents and Trademarks*